(12) United States Patent
Asnaashari

(10) Patent No.: US 9,612,958 B1
(45) Date of Patent: Apr. 4, 2017

(54) WEAR LEVELING AND IMPROVED EFFICIENCY FOR A NON-VOLATILE MEMORY DEVICE

(71) Applicant: Crossbar, Inc., Santa Clara, CA (US)

(72) Inventor: Mehdi Asnaashari, Danville, CA (US)

(73) Assignee: CROSSBAR, INC., Santa Clara, CA (US)

(*) Notice: Subject to any disclaimer, the term of this patent is extended or adjusted under 35 U.S.C. 154(b) by 0 days.

(21) Appl. No.: 14/743,658

(22) Filed: Jun. 18, 2015

(51) Int. Cl.
*G06F 12/02* (2006.01)
*G11C 13/00* (2006.01)

(52) U.S. Cl.
CPC ...... *G06F 12/0246* (2013.01); *G11C 13/0069* (2013.01); *G11C 13/0097* (2013.01)

(58) Field of Classification Search
CPC ............ G11C 13/0069; G11C 13/0097; G11C 13/0064; G06F 12/06
See application file for complete search history.

(56) References Cited

U.S. PATENT DOCUMENTS

| 2009/0080249 A1* | 3/2009 | Sprouse | G11C 11/5628 365/185.03 |
| 2009/0237979 A1* | 9/2009 | Mukai | G11C 7/18 365/148 |
| 2016/0005495 A1* | 1/2016 | Lasser | G11C 29/50004 711/103 |
| 2016/0020389 A1* | 1/2016 | Ratnam | G11C 13/004 257/2 |

* cited by examiner

*Primary Examiner* — Harry W Byrne
*Assistant Examiner* — Ajay Ojha
(74) *Attorney, Agent, or Firm* — Amin, Turocy & Watson, LLP

(57) ABSTRACT

Providing for improved cell longevity for two-terminal memory devices is described herein. By way of example, wear leveling and management of array operations is provided to reduce an average number of set or reset cycles employed for programming new data to a two-terminal memory device. Reduction in set and reset cycles can facilitate reduced wear over time, increasing longevity of the memory device and enabling larger numbers of lifetime array operations. Wear leveling can comprise comparing existing data stored within a target set of memory cells, to new data to be written to the target cells, and changing only cells having different values between the existing and new data. In some examples, new data can be inverted to reduce a number of program or erase pulses required to program the new data over the existing data, among other examples of disclosed wear leveling.

25 Claims, 18 Drawing Sheets

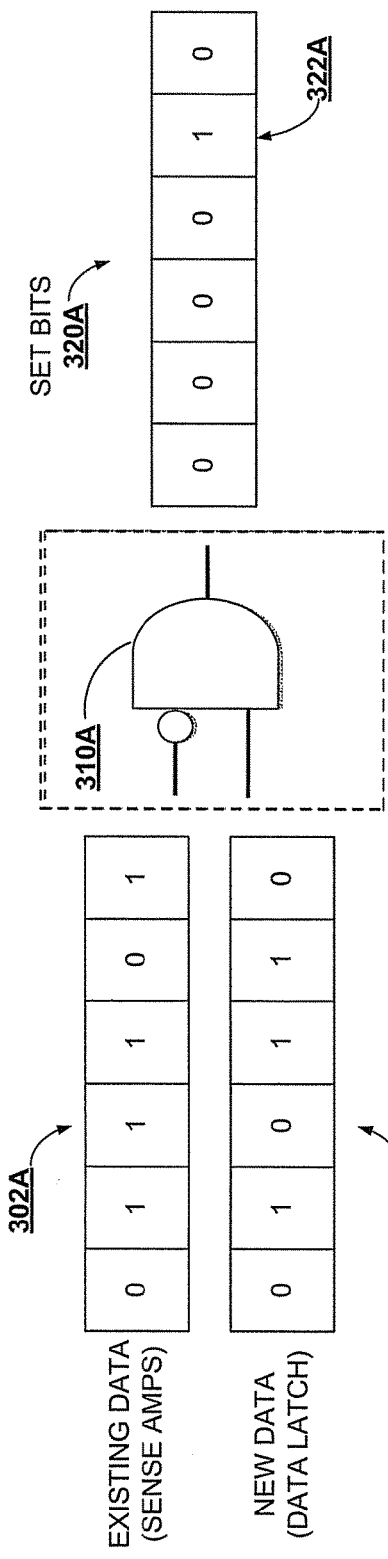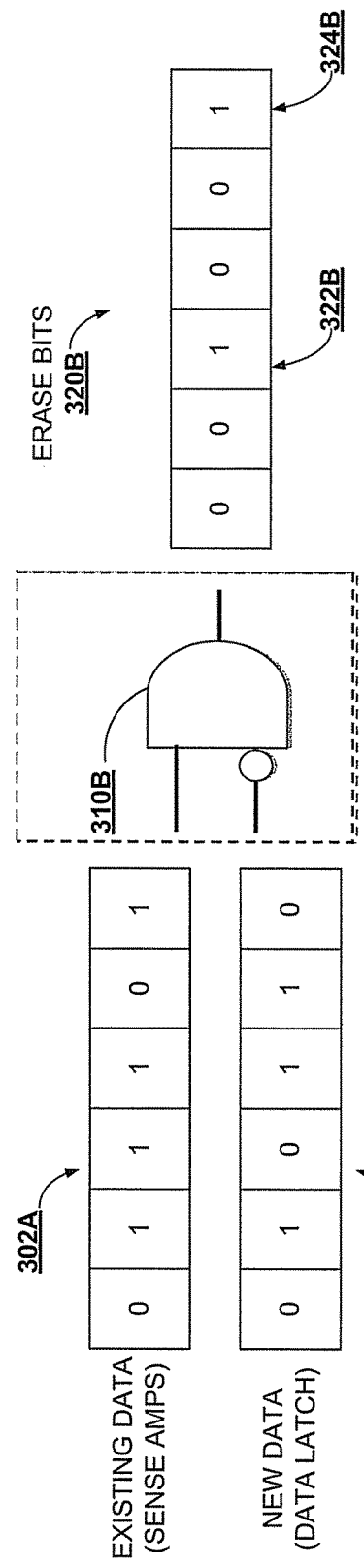
FIG. 3A
FIG. 3B

WEAR LEVELING AND IMPROVED EFFICIENCY FOR A NON-VOLATILE MEMORY DEVICE

TECHNICAL FIELD

This disclosure relates generally to electronic memory; as one example, the disclosure describes an electronic memory comprising multiple banks of non-volatile memory with a high-speed interface and expanded command and address bus.

BACKGROUND

A recent innovation within the field of integrated circuit technology is two-terminal memory technology. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor(s) of the present disclosure is further aware of a variety of two-terminal memory technologies, such as phase-change memory, magneto-resistive memory, conductive-bridging memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The subject disclosure provides for improved cell longevity including wear leveling for a two-terminal memory device. In various disclosed embodiments, program operation management can be provided to reduce an average number of set or reset cycles applied to memory cells of the two-terminal memory device. Reduction in set and reset cycles can facilitate reduced wear in response to programming operations implemented over time, increasing longevity of the memory device.

In one or more embodiments, program operation management can comprise comparing existing data stored within a target set of memory cells, to new data to be written to the target cells. Cells that have different bits from the existing data to the new data are changed, whereas cells whose bits remain are not programmed or erased. In this manner, a subset of the target cells is affected by respective programming operations, and on average reducing a number of set or reset cycles for multiple programming events.

In further embodiments, program operation management can comprise sensing existing data and comparing existing data to new data to be written to a set of target cells. In one embodiment, if the existing data comprises more set states than reset states, the target cells can all be reset (e.g., erased) and then the set bits of the new data can be written to the respective subset of target cells. Likewise, if the existing data comprises more reset states, the target cells can all be set, and then reset bits of the new data can be written to respective ones of those target cells. In another embodiment, if the new data comprises more set states than reset states, the target cells can all be set, and the fewer reset states of the new data can be written to an associated subset of the target cells. Likewise, if the new data comprises more reset states, the target cells can all be reset, and the fewer set states can be programmed to respective ones of the target cells.

In further embodiments, the present disclosure can weight wear leveling operations toward a reset state, or toward a set state. The weight can be established based on physical characteristics of set operations or reset operations, in various embodiments. For instance, where reset power consumption is lower than set power consumption, wear leveling can weight toward the reset state. For two-terminal memory devices in which the reverse is true, wear leveling can be weighted to favor the set state.

In one or more additional embodiments, data can be inverted to facilitate weighting a reset or set state. Where a program operation would result in changing more bits of a target set of cells from an existing state to a new state than would remain the same, the data can be inverted, and an invert bit set to note the inversion of the target set of cells. After inversion, the fewer number of cells could be programmed to program the target set of cells to an inverted state of the new data. Where the program operation would result in fewer bits of the target cells being changed, the new data can be written directly to the fewer bits, without inverting the data and without setting the invert bit. The various disclosed techniques tend to reduce a number of bits that are affected by array operations, reducing average power utilized for array operations and, on average, reducing power consumption for an associated electronic device.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure;

FIGS. 3A and 3B illustrate example circuit components to identify set bits and reset bits of new data to be written to target memory, in an embodiment;

DETAILED DESCRIPTION

Figure 1:
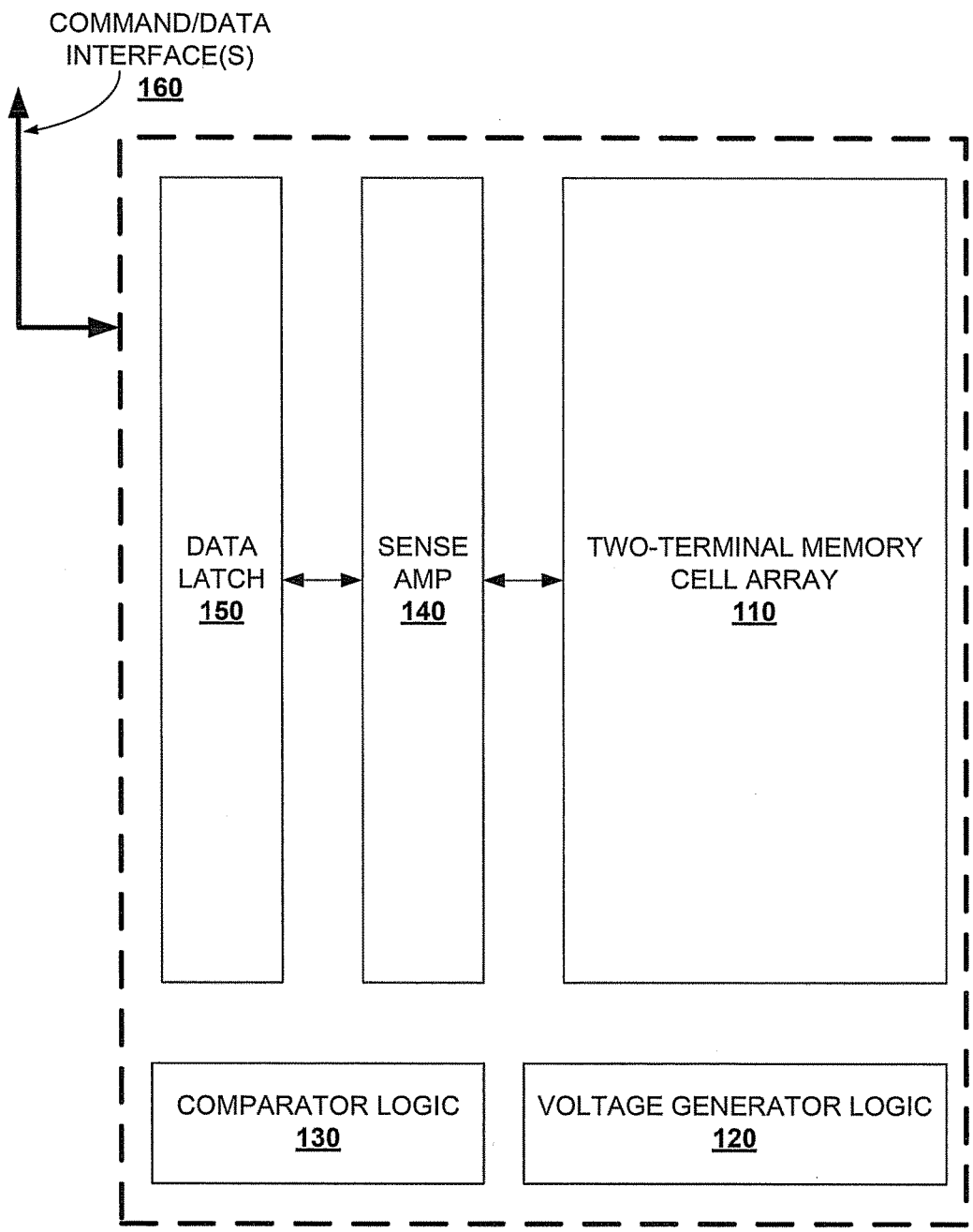
FIG. 1 illustrates a block diagram of an example two-terminal memory device according to one or more disclosed embodiments.

The present disclosure provides for data management techniques for improved longevity of two-terminal memory structures. Management of array operations to improve average cell longevity is often referred to as wear leveling. Non-volatile memory cells are often presumed to have a finite lifespan, for which data can be programmed to and reliably stored by the memory cells. Application of external stimulus to change data within these memory cells, while providing a mechanism for rewritable storage, can also affect physical characteristics of the memory cells. While these changes are small in response to single program or erase events, over time the changes can degrade the capacity to store data reliably. A memory cell that fails to meet a threshold probability of data retention has exhausted its useful lifespan, and is generally unusable and rendered inactive by controlling logic.

While an array of memory within a modern memory device has a very large number of memory cells, such that lifespan exhaustion (and inactivation) of a small percentage of memory cells may not noticeably affect the memory device, the inactivation of a few memory cells can be symptomatic of others being near end of useful life as well. Once a significant percentage of the array of memory cannot reliably store data, the memory device can also become unusable.

In some instances, the inventor(s) understands that a memory device can be detrimentally impacted by data management algorithms. For instance, some data stored at a memory device may be modified infrequently, whereas other data—such as maintenance or statistical data utilized to gauge efficacy of the memory device—may be updated quite regularly. If regularly updated data is written to a single block or blocks of memory cells of the memory device, these blocks will wear out quickly in terms of lifespan exhaustion. The inventor(s) is cognizant of wear leveling techniques that spread storage of regularly updated data over a much larger subset of a memory array than the size of the data, to spread out the program and erase operations associated with updating this data to the larger subset of the memory array. This type of wear leveling may extend memory device longevity, by mitigating early lifespan exhaustion of subsets of the memory array. (Matthew, what you're describing here is wear leveling technique done in flash. We are not doing that here. We are just minimizing the number of sets and rests in a cell. How frequent they're been accessed is not covered in this application; We're just minimizing the number of transitions; hence less wear and lower power.)

As an alternative to, or in addition to, the foregoing wear leveling techniques, the present disclosure provides for operational data management configured to reduce the average impact on memory cell longevity of respective program or erase operations. In various embodiments, the present disclosure can reduce impact of an array operation on a target subset of memory cells in response to changing a stored data pattern stored by the target subset of memory cells to a new data pattern. This can be accomplished, in some embodiments, by changing only memory cells that are different in the new data pattern from the stored data pattern. Because an x-bit (where x is a suitable positive integer) data pattern has a probability of having at least one bit in common with a new x-bit data pattern, changing only the bits that are not in common can reduce a number of program or erase cycles applied to individual memory cells to change the x-bit data pattern to the new x-bit data pattern. Reduction in number of program or erase cycles, as one example, is distinct from wear leveling techniques described above that do not affect a number of total write cycles, but rather spread out a given number of write cycles over larger sections of memory.

In still other embodiments, disclosed techniques can incorporate longevity-related characteristics of a memory device into data management techniques to extend memory cell longevity. Impact to longevity of a single program or erase cycle can be inversely related to power consumed by that program/erase cycle, or depending on technology, current consumption associated with the program or erase cycle. For resistive switching memory technologies, setting a bit to a low resistance state generally consumes significantly less current (and thus has lower impact on cell longevity) than resetting the bit to a high resistance state. Accordingly, various disclosed embodiments comprise weighting array operations toward resetting a memory cell, and away from setting the memory cell.

Referring now to the drawings, FIG. 1 illustrates a block diagram of a sample two-terminal memory device 100 according to one or more embodiments of the present disclosure. Two-terminal memory device 100 can be integrated as part of an electronic device, providing non-volatile rewritable data storage (e.g., write/erase many, read many), or one-time programmable data storage (e.g., write once, read many), for such device. In other embodiments, two-terminal memory device 100 can be a removable memory product (e.g., thumb drive, universal serial bus (USB) memory device, mini-USB memory device, micro-USB memory device, nano-USB memory device, dual inline memory module, and so on), whereas in other embodiments two-terminal memory device 100 can be an embedded memory product.

Two-terminal memory device 100 can comprise a two-terminal memory cell array 110, having one or more banks of memory (e.g., separately addressable and accessible subsets or arrays of memory) comprising a non-volatile, two-terminal memory cell technology. Examples of a suitable two-terminal memory cell technology can comprise resistive switching memory (e.g., resistive random access memory (RRAM)), phase-change memory, magneto-resistive memory, conductive bridging memory, organic memory, and others. Array operations can be implemented at two-terminal memory cell array 100 in response to program, erase, inhibit, etc., signals applied to addressable subsets thereof. Voltage generator logic 120 can be provided to form these or similar signals in response to suitable clock pulses (not depicted).

Additionally, two-terminal memory cell array 110 can comprise a sense amp 140 configured to receive signals stored by subsets of two-terminal memory cell array 110, and measure a value of respective signals. Comparator logic 130 can be employed to interpret measured signal values into data (e.g., binary "0"s or "1"s). Additionally, a data latch 150 can receive data to be written to two-terminal memory cell array 110, or data read from sense amps 140 and comparator logic 130 to be output to an external device. Such device can be accessed via one or more command/data interfaces 160. Command/data interface(s) 160 can communicatively connect two-terminal memory device 100 with a control device, such as a memory controller, a computer, a host device, and so forth.

In some embodiments, disclosed data management techniques can be stored at an external control device. In such embodiments, instructions consistent with the data management techniques are generated by the external control device and provided to two-terminal memory device 100 over command/data interface(s) 160. In other embodiments, two-terminal memory device 100 can store logic related to the data management techniques, and an onboard controller (not depicted, but see FIGS. 17, 18, infra) can receive array operation commands over command/data interface(s) 160, and translate or implement the commands consistent with the data management techniques described herein.

Figure 2:
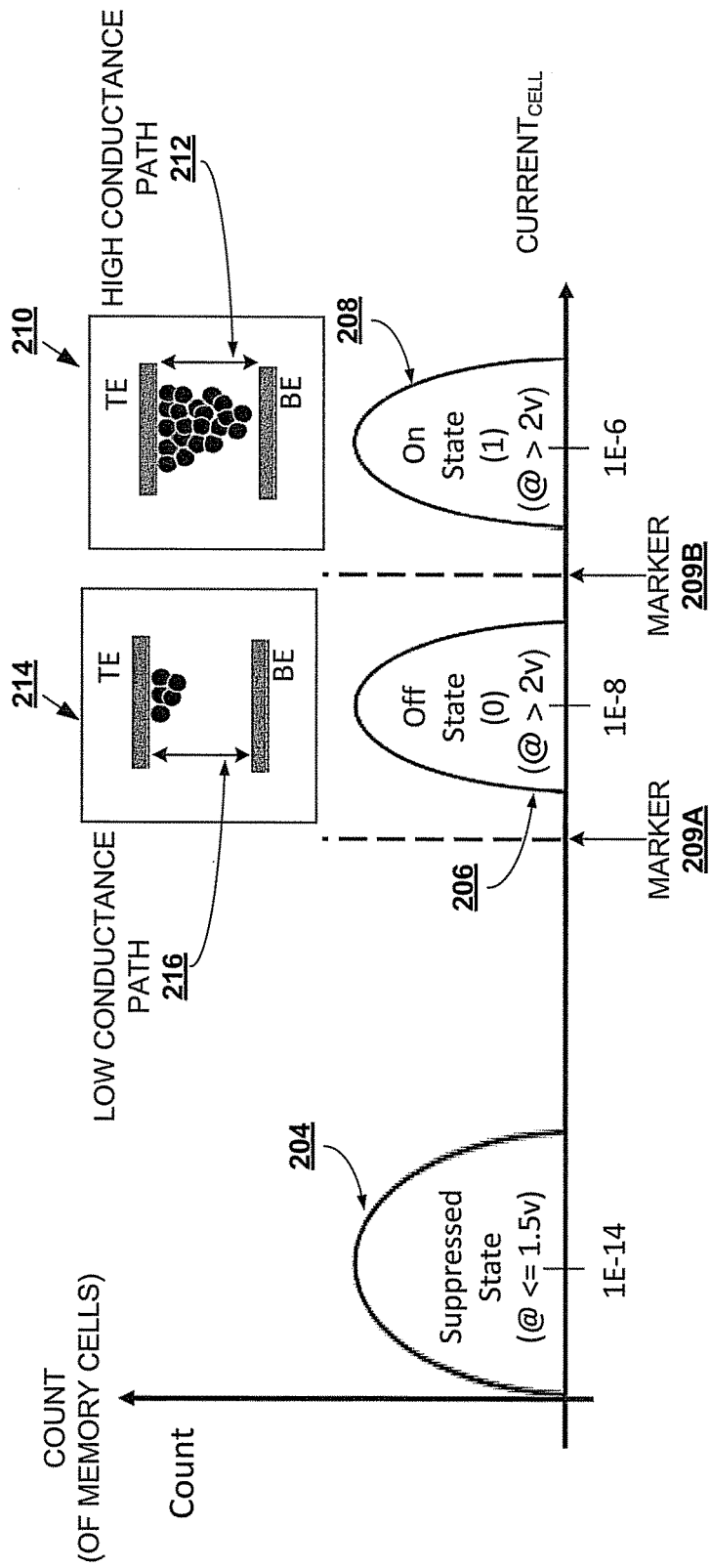
FIG. 2 depicts a block diagram of example state distributions for set bits and reset bits according to one or more embodiments.

Referring to FIG. 2, there is illustrated a diagram of example state distributions 200 for a two-terminal memory device according to various embodiments of the present disclosure. The diagram for example state distributions 200 measures count of memory cells (e.g., number of memory cells within an array) on a vertical axis, and electrical current within a cell (e.g., in response to a specified voltage) on a horizontal axis. Three separate states are depicted: a suppressed state 204, an off memory state 206 (e.g., 0 bit), and an on memory state 208 (e.g., 1 bit). Suppressed state 204 can represent a deactivated memory cell; this can occur, for instance, when a selection device associated with a memory cell has a high selection resistance, resulting in very low current through the memory cell (e.g., about 10E-14 amps at about 1.5 volts). Off memory state 206 can represent an activated memory cell, having a non-volatile device in a low memory state. This can be provided by the selector device being in an activated state having a low selection resistance, and the non-volatile device in the low memory state. This low memory state can exhibit about 1E-8 amps of current (e.g., at about 2 volts), and can be delineated by an off-state marker 209A. On memory state 208 can represent an activated memory cell, having a non-volatile device in a high memory state. This can be provided by the selector device being in an activated state having low selection resistance, and the non-volatile device in a high memory state. The high memory state can exhibit about 1E-6 amps of current (e.g., at about 2 volts), and can be delineated by an on-state marker 209B.

Examples of the low memory state and high memory state are illustrated by low state diagram 214 and high state diagram 210. High state diagram 210 depicts a pair of electrodes, top electrode (TE) and bottom electrode (BE), with significant penetration of conductive particles between the TE and the BE, facilitating a relatively high conductance path 212. The high conductance path 212 facilitates the relatively high 10E-6 current for the high memory state. Likewise, low state diagram 214 illustrates little penetration of conductive particles between the TE and the BE, resulting in a relatively low conductance path 216. This low conductance path 216 facilitates the relatively low 10E-8 current for the low memory state.

It should be appreciated that example state distributions 200 are illustrative, and not intended to define or imply a scope of suitable memory devices to which the disclosed data management or wear leveling techniques can apply. As such, other state distributions associated with various memory devices can be employed for one or more disclosed embodiments. Further, some memory devices may not have a selector device, and thus the state distributions of such memory devices may have no suppressed state 204, or can have different types of selection devices having different selection resistances, or can have multiple non-volatile cells activated or deactivated by a single selection device, and thus leakage current can result in different effective selection resistance per cell, and so on.

Though example state distributions 200 can vary according to memory cells employed for a memory device, they illustrate the difference in current consumption for an off memory state 206 and an on memory state 208 of some two-terminal memory technologies. This difference in current consumption can be leveraged by disclosed embodiments, to enhance longevity of memory cells. For instance, by managing memory array operations to favor switching from off memory state 206 to on memory state 208, average current consumption can be reduced for respective array operations. This reduced current consumption can further increase memory cell longevity.

FIGS. 3A and 3B illustrate block diagrams of example circuit components 300A, 300B to facilitate wear leveling for an array operation according to embodiments of the present disclosure. Referring first to FIG. 3A, an existing data pattern 302A is depicted, comprising a set of bits stored by two-terminal memory cells of a memory cell array, such as two-terminal memory cell array 110 of FIG. 1, supra. Existing data pattern 302A can be read into a set of sense amps (e.g., sense amps 140) and bit values of existing data pattern 302A determined by a comparator device (e.g., comparator logic 130). Further, a new data pattern 304A is depicted, to be written to the two-terminal memory cells. New data pattern 304A can be received from a host or controller (e.g., over command/data interface(s) 160) and stored in temporary memory (e.g., data latch 150). Bit values of new data pattern 304A can also be determined by the comparator device.

A first circuit component 310A receives as inputs existing data pattern 302A and new data pattern 304A. Further, first circuit component 310A can be configured to identify which bits of existing data pattern 302A would have to be set to a "1" (e.g., programmed) from a "0", to match corresponding bits of existing data pattern 302A. An output of first circuit component 310A is a group of set bits 320A. Set bits 320A are high (e.g., 1) for bits that are both "0" in existing data pattern 302A and "1" in new data pattern 304A, and low (e.g., "0") for bits that are either not "0" in existing data pattern 302A, or are not "1" in new data pattern 304A. As depicted by FIG. 3A, a fifth bit from the left, bit 322A, would be set from "0" to "1" to match new data pattern 304A.

FIG. 3B illustrates a second circuit component 310B also having inputs of existing data pattern 302A and new data pattern 304A. Second circuit component 310B can be configured to identify which bits of existing data pattern 302A would have to be reset to a "0" (e.g., erased) from a "1", to match corresponding bits of existing data pattern 304A. An output of second circuit component 310B is a group of erase bits 320B. Erase bits 320B are low (e.g., "0") for bits that are either not a "1" in existing data pattern 302A, or are not a "0" in new data pattern 304A, and are high (e.g., "1") for bits that are both "1" in existing data pattern 302A and "0" in new data pattern 304A. Thus, for the example of FIG. 3B, a third bit from the left 322B and the right-most bit 324B are high, and the other bits are low.

When taken together, set bits 320A and erase bits 320B identify which of the two terminal memory cells storing existing data pattern 302A would need to be changed to write new data pattern 304A to the two terminal memory cells. For the example of FIGS. 3A and 3B, only three bits would need to be changed, 322A, 322B and 324B, to write new data pattern 304A to two-terminal memory cells storing existing data pattern 302A. In conventional programming, all memory cells would be reset to 0 and new data would be programmed to the memory cells. For a 6-cell data set, this would involve six erase/program cycles. In various disclosed embodiments, only data required to be changed to match a new data pattern would receive a program or erase cycle; for the example of FIGS. 3A and 3B, three program or erase cycles would be employed, significantly reducing the number of program/erase cycles required to write new data pattern 304A to memory cells storing existing data pattern 302A.

Figure 4:
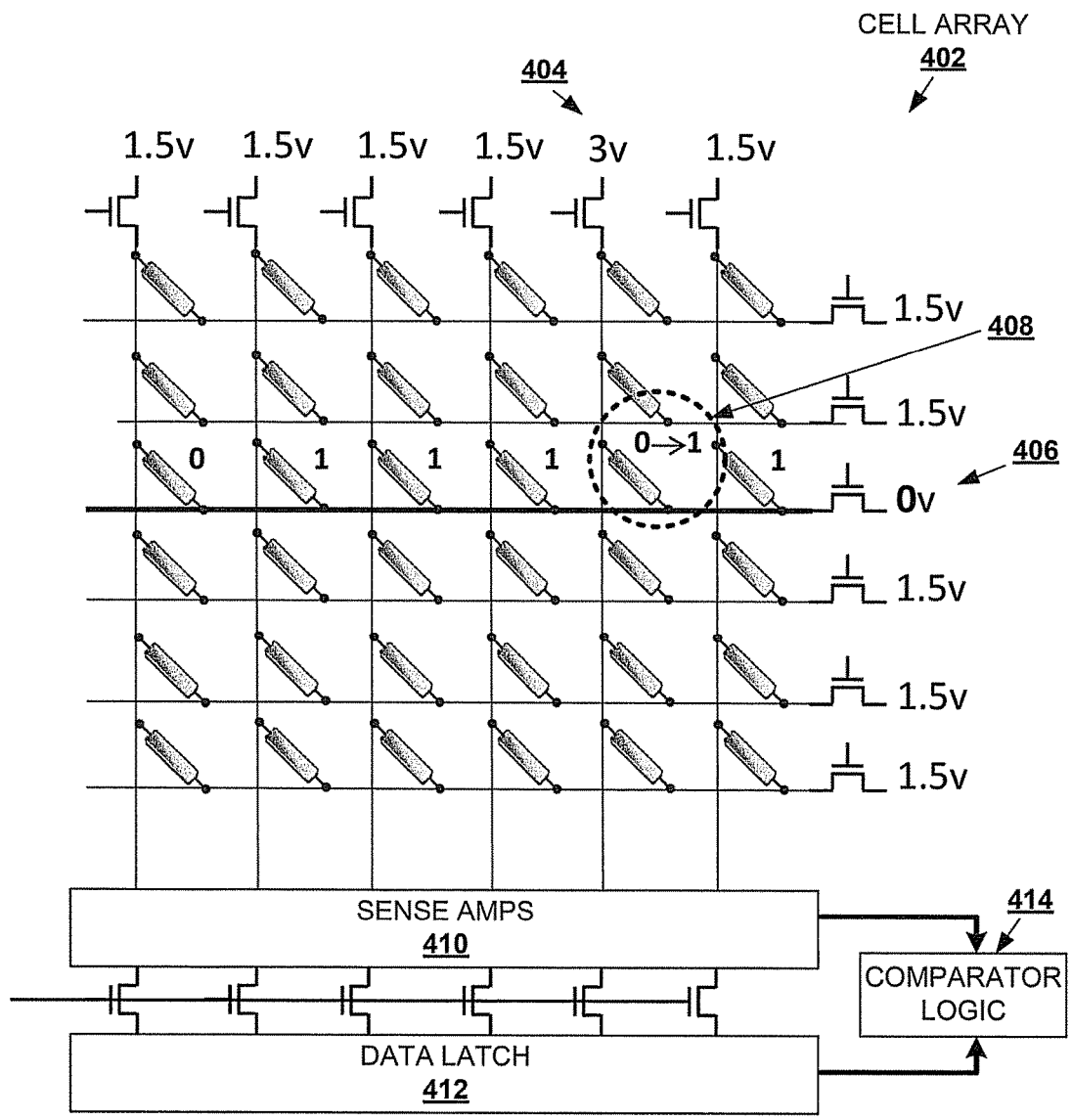
FIGS. 4-5 depict diagrams of example memory array implementations of an example wear leveling operation, in an embodiment.

FIG. 4 illustrates a diagram of an example memory device 400 associated with writing existing data pattern 302A to new data pattern 304A, according to embodiments of the present disclosure. Memory device 400 illustrates a set bits phase of the writing. As depicted, memory device 400 comprises a 6×6 cell array 402 of two-terminal memory cells, located at intersections of respective bitlines 404 and wordlines 406 of cell array 402. Sense amps 410 can be employed to load data (e.g., read) from cells on one of wordlines 406 and comparator logic 414 for measuring bit values of the data loaded into sense amps 410. Additionally, a data latch 412 can receive new data to be written to the cells of the wordline, and bit values of the new data can also be measured by comparator logic 414.

Continuing the example of FIGS. 3A and 3B, one memory cell 408 storing a "0" can be programmed to a "1". The programming can be accomplished with a single program cycle of memory cell 408, changing the data value stored by memory cell 408 to a "1". For two-terminal memory cells such as resistive switching cells, this can be accomplished without first applying an erase pulse, in some embodiments.

Figure 5:
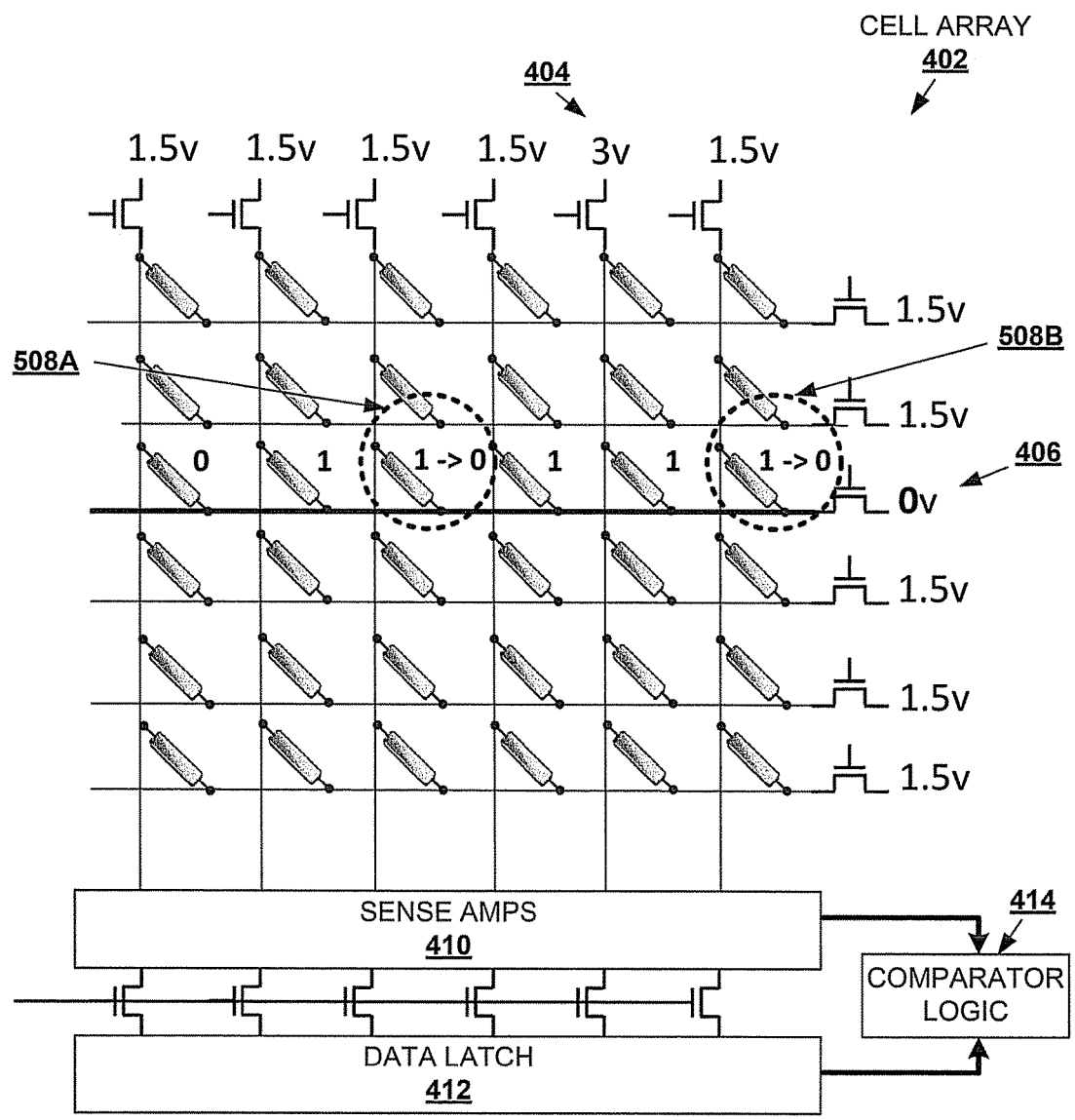

Referring now to FIG. 5, a diagram of an example memory device 500 is depicted in an erase bits phase, according to further embodiments. Memory device 500 can be substantially similar to memory device 400, including a 6×6 array of memory cells at intersections of respective bitlines 404 and wordlines 406, and including sense amps 410, data latch 412 and comparator logic 414. Memory device 500 illustrates an erase phase of programming new data pattern 304A to memory cells storing existing data pattern 302A. Although the erase phase is illustrated as following program phase of FIG. 4, supra, the erase phase can be implemented before the program phase, in various embodiments.

Two memory cells storing a "1" are changed to a "0" as part of the erase phase, including memory cell 508A and memory cell 508B. An erase cycle can be applied to each of these memory cells 508A, 508B, changing their bit values to "0". The erase cycle can be facilitated with one erase pulse in various embodiments, depending on a technology employed for the memory cells of cell array 402. As an example, resistive switching memory cells can be erased in response to a suitable negative voltage, though the negative voltage can comprise one or more sub-pulses of differing negative voltage values in some embodiments. Following the erase pulse depicted by FIG. 5 and the program pulse depicted by FIG. 4, cell array 402 can be changed from existing data pattern 302A to new data pattern 304A with fewer program/erase pulses than would conventionally be employed. As a result, average longevity of memory cells on the target wordline can be increased by reducing overall exposure to program or erase pulses required to write new data over existing data.

As an addendum to FIGS. 4 and 5, it is noted that cell array 402 is illustrated as a one-transistor, many resistive (1TnR, where n is an integer greater than 1) cell array 402. In such an arrangement, multiple memory cells are activated or deactivated by a single transistor. It should also be appreciated that the disclosed embodiments can be implemented with a one-transistor, one-resistor (1T1R) memory cell, in which each memory cells is activated or deactivated by its own transistor.

Figure 6:
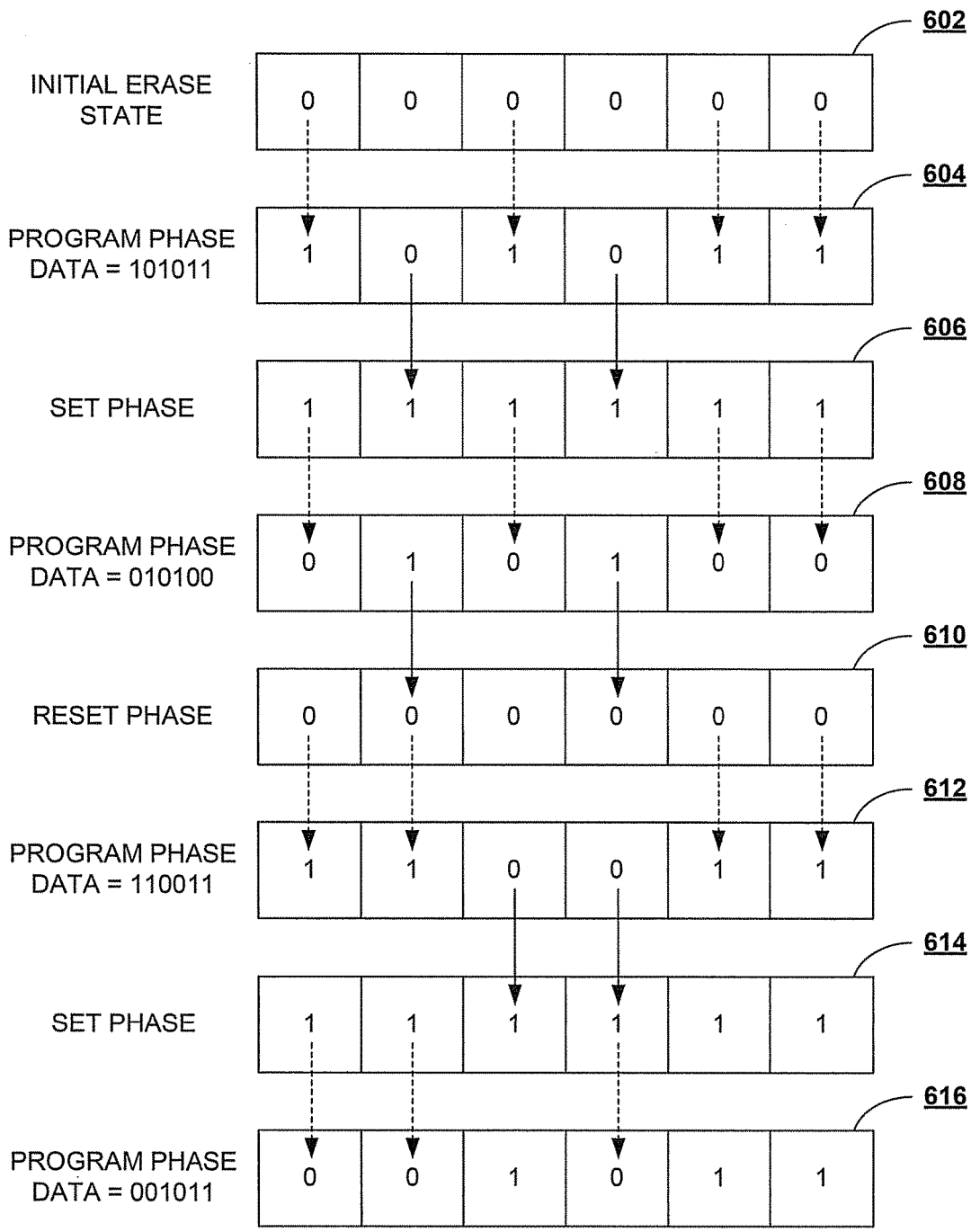
FIG. 6 illustrates a block diagram of an example data swap operation according to disclosed wear leveling techniques, in a further embodiment.

FIG. 6 illustrates a diagram of an example set of programming sequences illustrating a selective write or erase programming, according to alternative or additional embodiments of the present disclosure. Selective write/erase programming can comprise determining whether an existing data pattern comprises more set bits ("1"s) than reset bits ("0"s). In the event of more set bits, the remainder of reset bits are set to make the existing data pattern comprised solely of set bits. In the event of more reset bits, the remainder of set bits are reset to make the existing data pattern comprised solely of reset bits (e.g., see FIG. 9, infra, for an example flowchart of selective write/erase programming). From uniform set bits or uniform reset bits, a program phase is initiated in which "0"s (or "1"s) are programmed to respective ones of the uniform set bits (or reset bits) to match a new data pattern.

The set of programming sequences of FIG. 6 illustrate several set phase (or reset phase)—program phase combinations according to the selective write or erase programming. An initial erase state is illustrated by data set 602. A set of new data 1-0-1-0-1-1 is received, and "1"s of the new data are programmed to the initial erase state resulting in data set 604 comprising the set of new data. Data set 604 comprises more "1"s than "0"s, and in response to receipt of a second new data set 0-1-0-1-0-0, a set phase is initiated and the two "0"s of data set 604 are set to "1"s, forming a uniform set data 606. A program phase is initiated, resetting only bits that are "0" in the second new data set from "1" in the uniform set data 606. The result is data set 608. In response to a third new data set 1-1-0-0-1-1, data set 608 is analyzed to determine whether more "1"s or more "0"s exist in data set 608. Since more "0"s exist, the "1"s are reset to form a uniform reset data 610. Bits that are "1" in the third new data set are programmed from the uniform reset data 610, to achieve data set 612 matching the third new data set. Because data set 612 has more "1"s than "0"s, the "0"s of data set 612 are programmed to "1"s in response to receipt of a fourth new data set 0-0-1-0-1-1, to form a uniform set data 614. Bits that are "0" in the fourth new data set are erased from the uniform set data 614, to achieve data set 616 matching the fourth new data set.

Selective write/erase programming 600 is an alternative mechanism to reduce a number of program/erase cycles involved in changing a data set to a new data set. As described above, conventional non-volatile programming first erases all cells of a target group of cells, then programs the target group of cells. In the event that most or all cells are programmed, the erasure of all cells applies an erase pulse to most or all cells of the target group. For the selective write/erase programming 600, no more than half of a target group of cells can be subject to an erase pulse or program pulse, prior to subsequent programming. Accordingly, the selective write/erase programming 600 can reduce wear on the target group of cells, enhancing cell longevity.

In an alternative embodiment, selective program/erase programming 600 can determine whether new data has more "1"s or more "0"s, rather than existing data. In the alternative embodiment, respective "0" bits of existing data can be selectively set to achieve uniform set bits when the new data has more "1"s than "0"s. This ensures that the subsequent reset phase will apply an erase pulse to no more than half the bits. Likewise, respective "1" bits of existing data can be selectively reset to achieve uniform reset bits when the new data has more "0"s than "1"s. This ensures that a subsequent set phase will apply a program pulse to no more than half the bits. Accordingly, the selective program/erase programming can facilitate a reduction in average program or erase cycles to facilitate programming data to two-terminal memory cells.

Figure 7:
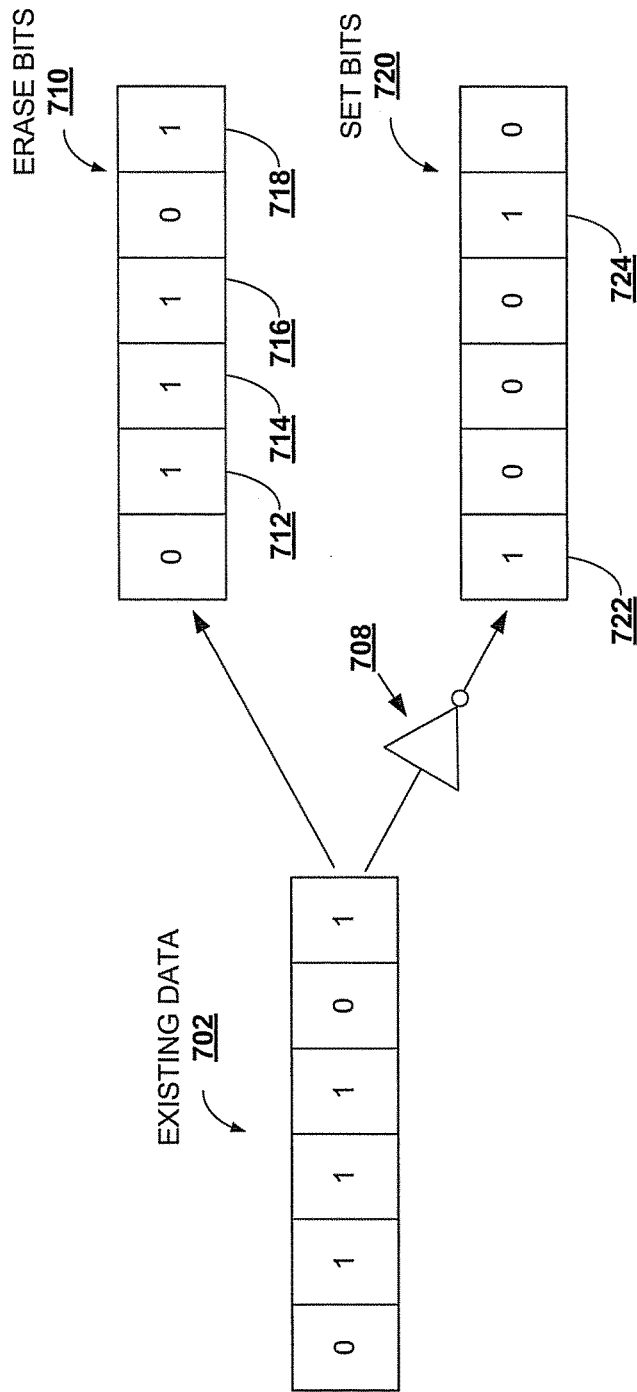
FIG. 7 depicts an example progression of data for a set of write operations according to a further embodiment.

FIG. 7 illustrates a diagram of an example data comparator 700 to facilitate selective write or erase programming according to one or more embodiments of the present disclosure. As described at FIG. 6, selective write or erase programming can comprise determining whether existing data (or new data) comprises more "1"s than "0"s, and setting or resetting a data pattern to a uniform state before programming new data. In some embodiments, a set of existing data 702 is provided comprising a data pattern 0-1-1-1-0-1 (in other embodiments, set of existing data 702 can instead be a set of new data). Set bits of existing data 702 are identified in an erase bits 710 subgroup, which matches existing data 702, and indicates a number of bits that would need to be erased to achieve uniform reset bits. In the example of FIG. 7, erase bits 710 comprise four set bits, including bits 712, 714, 716, 718, which would require four bits to be reset to achieve the uniform reset bits. An inverter 708 is provided to generate a set bits 720 subgroup, which is an inversion of existing data 702. The set bits subgroup 720 illustrates a number of bits that would have to be reset to achieve uniform set bits of existing data 702. As indicated, only 2 bits, bits 722 and 724, would be required to be set to "1" in existing data 702 to achieve the uniform set state. Accordingly, by selecting the uniform set state, a number of program or erase pulses required to achieve a uniform set or reset state can be reduced from four pulses (e.g., applied to 712, 714, 716, 718) to two pulses (e.g., applied to 722, 724).

In view of the exemplary diagrams described supra, process methods that can be implemented in accordance with the disclosed subject matter will be better appreciated with reference to the flow charts of FIGS. 8-10, 15 and 16. While for purposes of simplicity of explanation, the methods of FIGS. 8-10, 15 and 16 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 8:
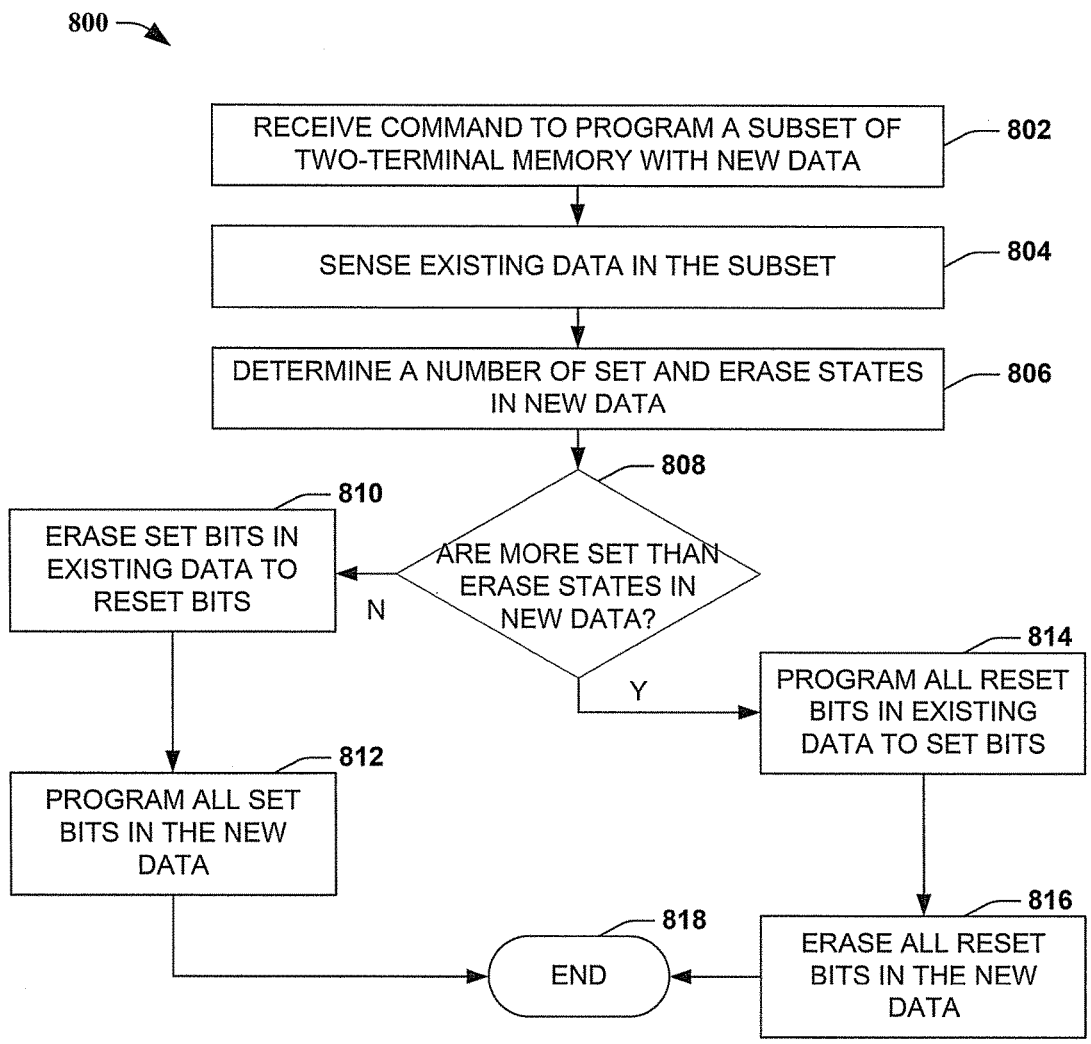
FIG. 8 illustrates a flowchart of an example method for facilitating wear leveling and operation management according to one or more embodiments.

FIG. 8 depicts a flowchart of an example method 800 for providing selective write/erase programming according to one or more disclosed embodiments. At 802, method 800 can comprise receiving a command to program a subset of two-terminal memory with new data. At 804, method 800 can comprise sensing existing data in the subset. At 806, method 800 can comprise determining a number of set state bits or reset state bits in the new data. At 808, method 800 can comprise determining whether more set state bits exist in the new data; method 800 can proceed to 810 if there are not more set bits in the new data, and can proceed to 814 if there are more set bits in the new data.

At 810, method 800 can comprise erasing set states in existing data to erase states, resulting in the subset of memory cells all in a reset state. At 812, method 800 can comprise programming suitable ones of the subset of memory cells to the set state that match set state bits of the new data. From 812, method 800 can end at 818.

At 814, method 800 can comprise setting all erase state bits in the existing data to a set state, resulting in the subset of memory cells all in the set state. At 816, method 800 can comprise erasing suitable ones of the subset of memory cells to the reset state to match reset state bits of the new data. At 818, method 800 can end.

Figure 9:
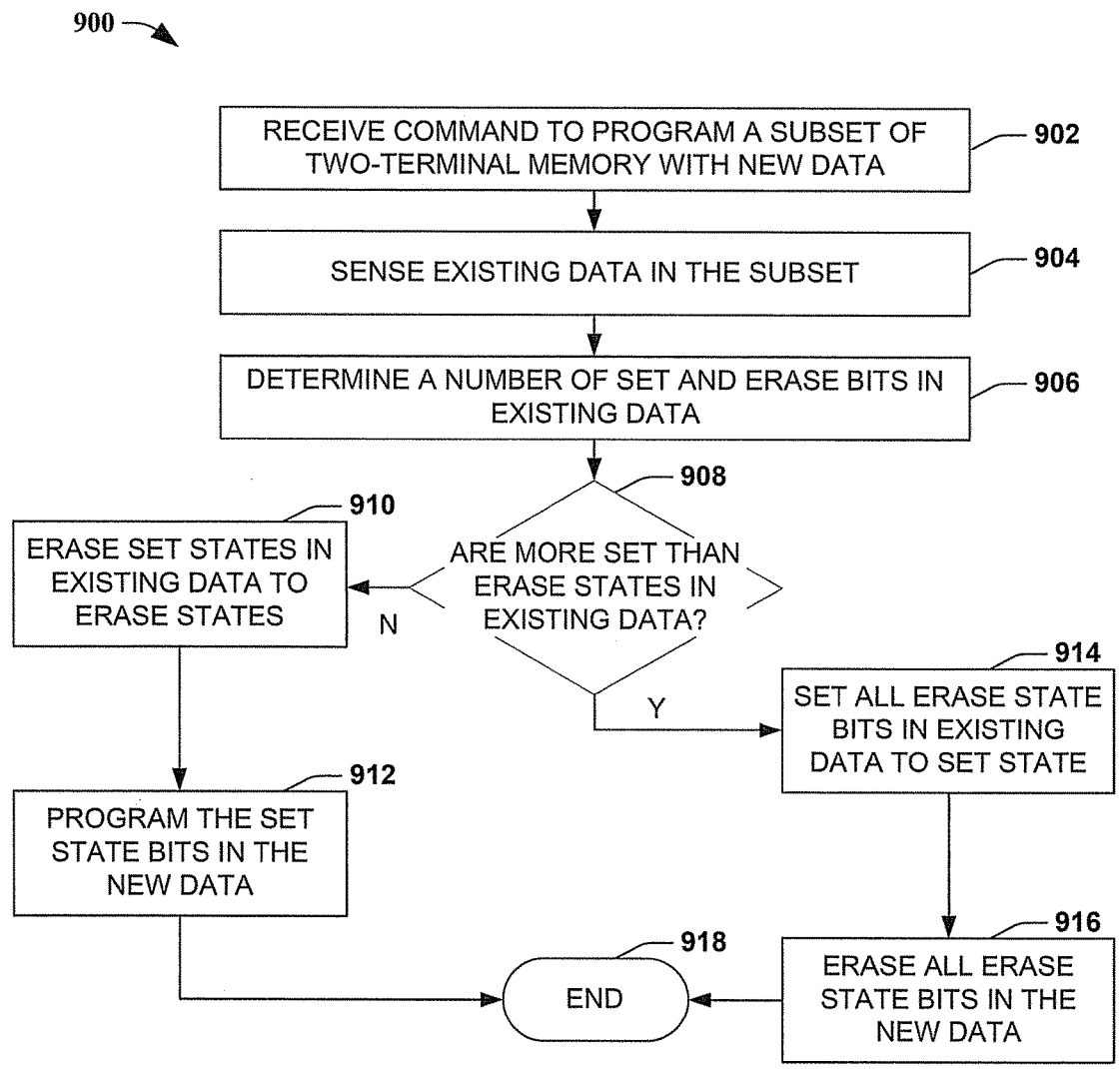
FIG. 9 depicts a flowchart of a sample method for facilitating wear leveling and operation management according to a further embodiment.

FIG. 9 depicts a flowchart of a sample method 900 for providing selective write/erase programming according to alternative embodiments. At 902, method 900 can comprise receiving a command to program a subset of two-terminal memory with new data. At 904, method 900 can comprise sensing existing data in the subset of two-terminal memory. At 906, method 900 can comprise determining a number of set state and erase state bits in the existing data. At 908, method 900 can comprise determining whether the existing data has more set state bits or more reset state bits. If more set state bits, method 900 can proceed to 914; otherwise, method 900 can proceed to 910.

At 910, method 900 can comprise erasing set state bits of the existing data to erase state bits, resulting in the subset of two-terminal memory being all in the reset state. At 912, method 900 can comprise programming the set state bits of the new data to the subset of two-terminal memory. The new data is programmed to the subset of two-terminal memory following programming at 912, and method 900 can proceed from 912 to 918 and end.

At 914, method 900 can comprise setting all erase state bits in existing data to the set state, resulting in the subset of two-terminal memory being all in the set state. At 916, method 900 can comprise erasing the reset state bits of the new data to the subset of two-terminal memory. Method 900 can proceed to 918 and end.

Figure 10:
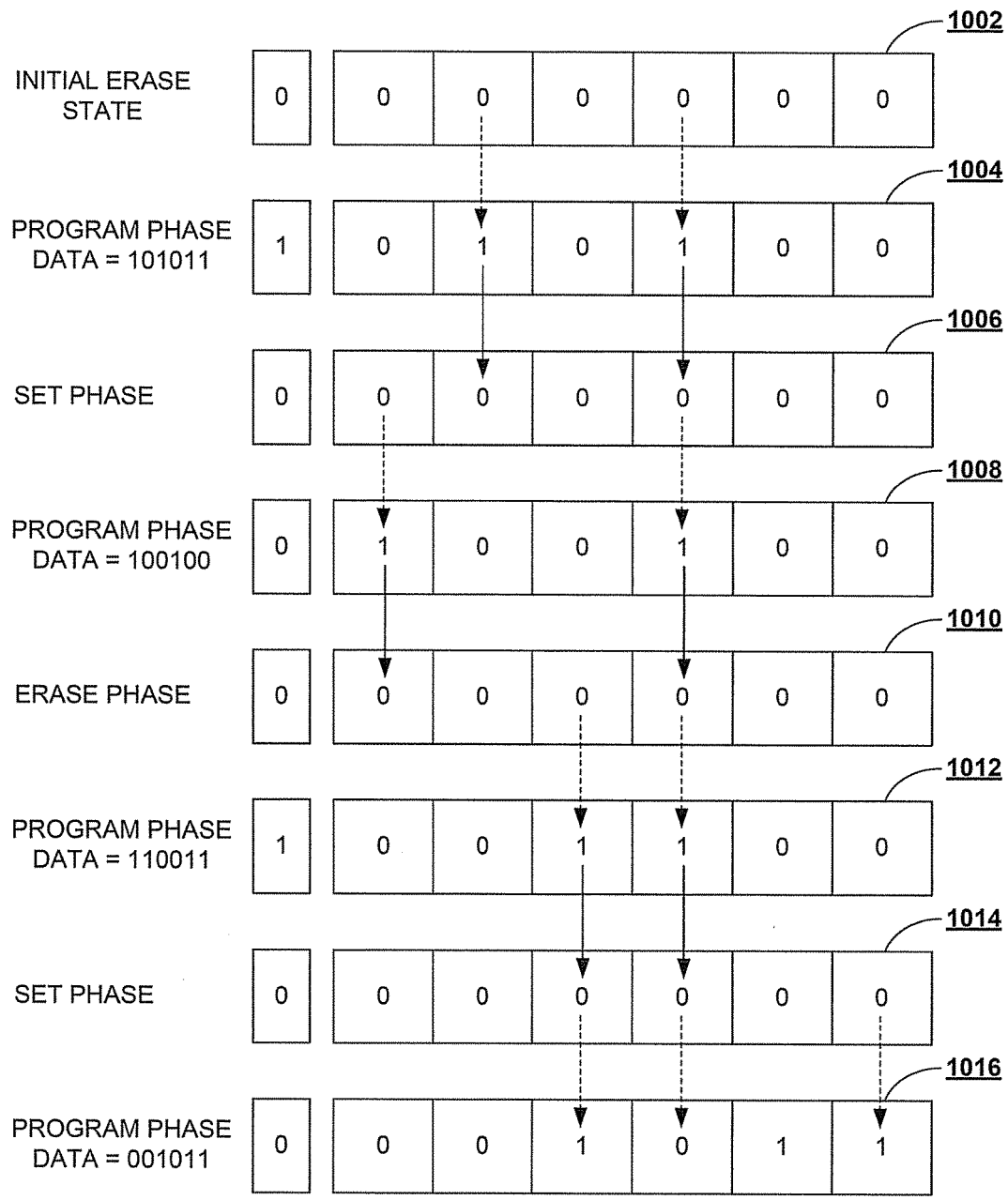
FIG. 10 illustrates a flowchart of an example method for facilitating wear leveling utilizing bit state weighting, according to an embodiment.

FIG. 10 illustrates a diagram of an example set of write/erase sequences 1000 illustrating weighted write/erase programming according to alternative or additional embodiments of the present disclosure. The weighted write/erase programming can give preference to resetting bits or setting bits in advance of programming data to a subset of memory cells, depending on characteristics of a set pulse or reset pulse. For instance, where the reset pulse consumes less current or power than the set pulse, the weighted write/erase programming can reset any set bits of an existing data set, resulting in the subset of memory cells being in the reset state. Further, if the new data set comprises more set bit states, an invert memory bit can be set, and an inversion of the new data set can be written to the subset of memory cells. In this manner, no more than half the subset of memory cells will receive a set pulse when programming to the new data set. When the subset of memory cells is again reset, the invert memory bit can be reset.

The set of write/erase sequences 1000 begins with the subset of memory cells in a reset state 1002. A first new data set 1-0-1-0-1-1 is received, having more set bit states than reset bit states. The invert bit is therefore set, and an inverted new data set is written to the subset of memory cells at 1004. In response to receiving a second new data set 1-0-0-1-0-0, the subset of memory cells is again reset, requiring erasure of only two cells. The invert bit is reset, and because the second new data set has fewer set bits than reset bits, the two set bits are programmed to the subset of memory cells at 1008. Following receipt of a third new data set 1-1-0-0-1-1, the two set bits from 1008 are reset during an erase phase at 1010, and the invert bit is maintained in the reset state. Because the third new data set has more set bits than reset bits, the invert bit is set and an inverse of the third new data set is written to the subset of memory cells, again requiring only two program pulses at 1012. The two set bits from 1012 are again reset at 1014, along with the invert bit, in response to receipt of a fourth new data set 0-0-1-0-1-1. Because the number of set bits and reset bits is even, the fourth new data is written to the subset of memory cells with three program pulses at 1016, and the invert bit is maintained in the reset state.

Figure 11:
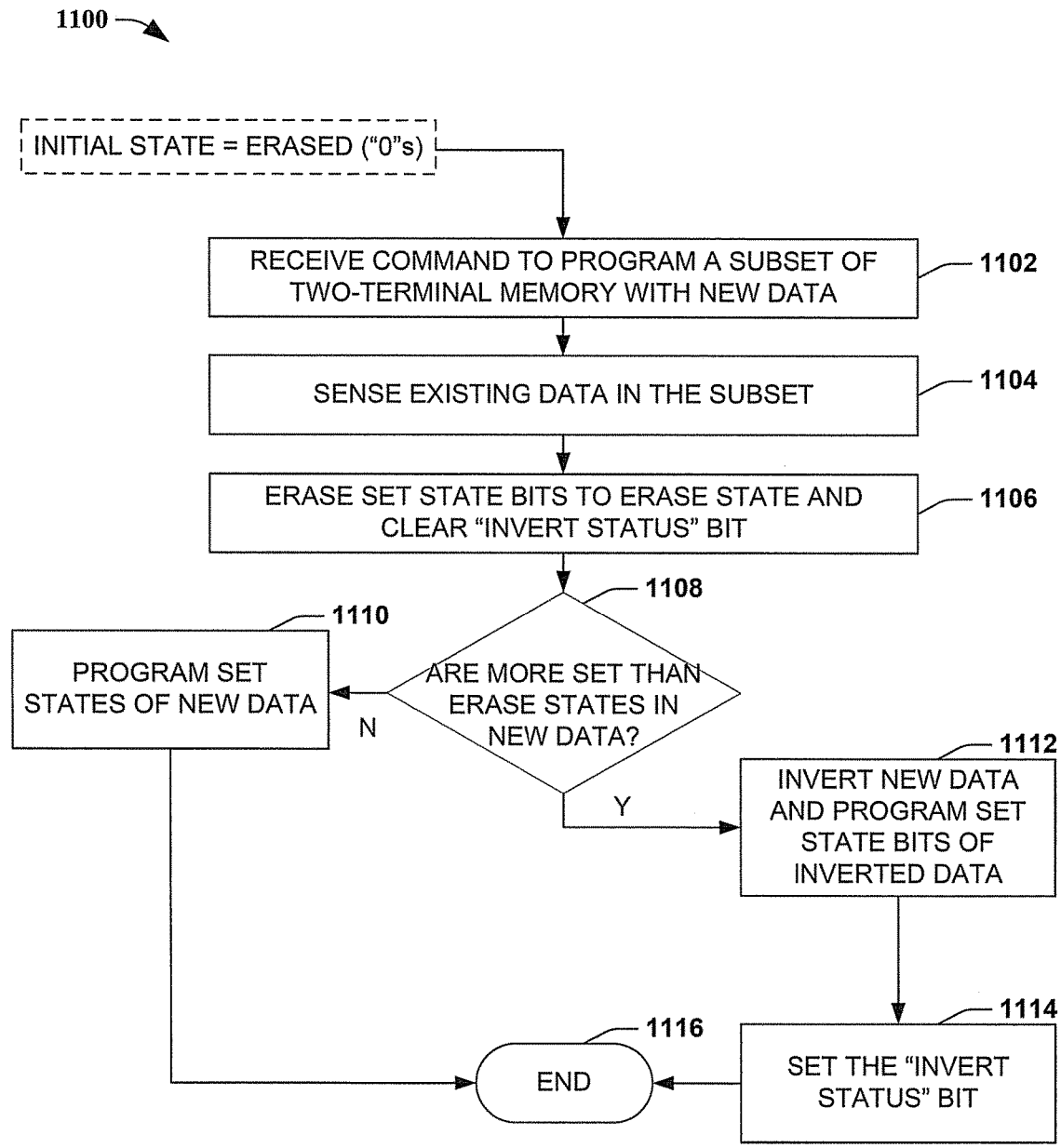
FIG. 11 illustrates a diagram of an example progress of data for a set of write operations utilizing bit state weighting, in an embodiment.

FIG. 11 depicts a flowchart of an example method 1100 for providing weighted write/erase programming according to various embodiments. At 1102, method 1100 can comprise receiving a command to program a subset of two terminal memory with new data. At 1104, method 1100 can comprise sensing existing data in the subset of two terminal memory. At 1106, method 1100 can comprise erasing set state bits of the subset of two terminal memory (if any) to a reset state and clearing an invert status bit. At 1108, a determination is made as to whether more set state bits than reset state bits are in the new data. If the new data has more set state bits, method 1100 can proceed to 1112; otherwise method 1100 can proceed to 1110.

At 1110, method 1100 can comprise programming set state bits of the new data to appropriate ones of the subset of two terminal memory. The programming can be accomplished by applying the program pulse to no more than half the subset of the two-terminal memory. From 1110, method 1100 can proceed to 1116 and end.

At 1112, method 1100 can comprise inverting the new data and programming set state bits of the inverted data to associated ones of the subset of two terminal memory. Additionally, at 1114, the invert status bit is set. Again, the programming can be accomplished with programming no more than half the memory cells. In addition to the foregoing, to program additional data to the subset of two terminal memory, no more than half the memory cells will need to be erased to clear all of the subset of memory cells prior to the programming.

Figure 12:
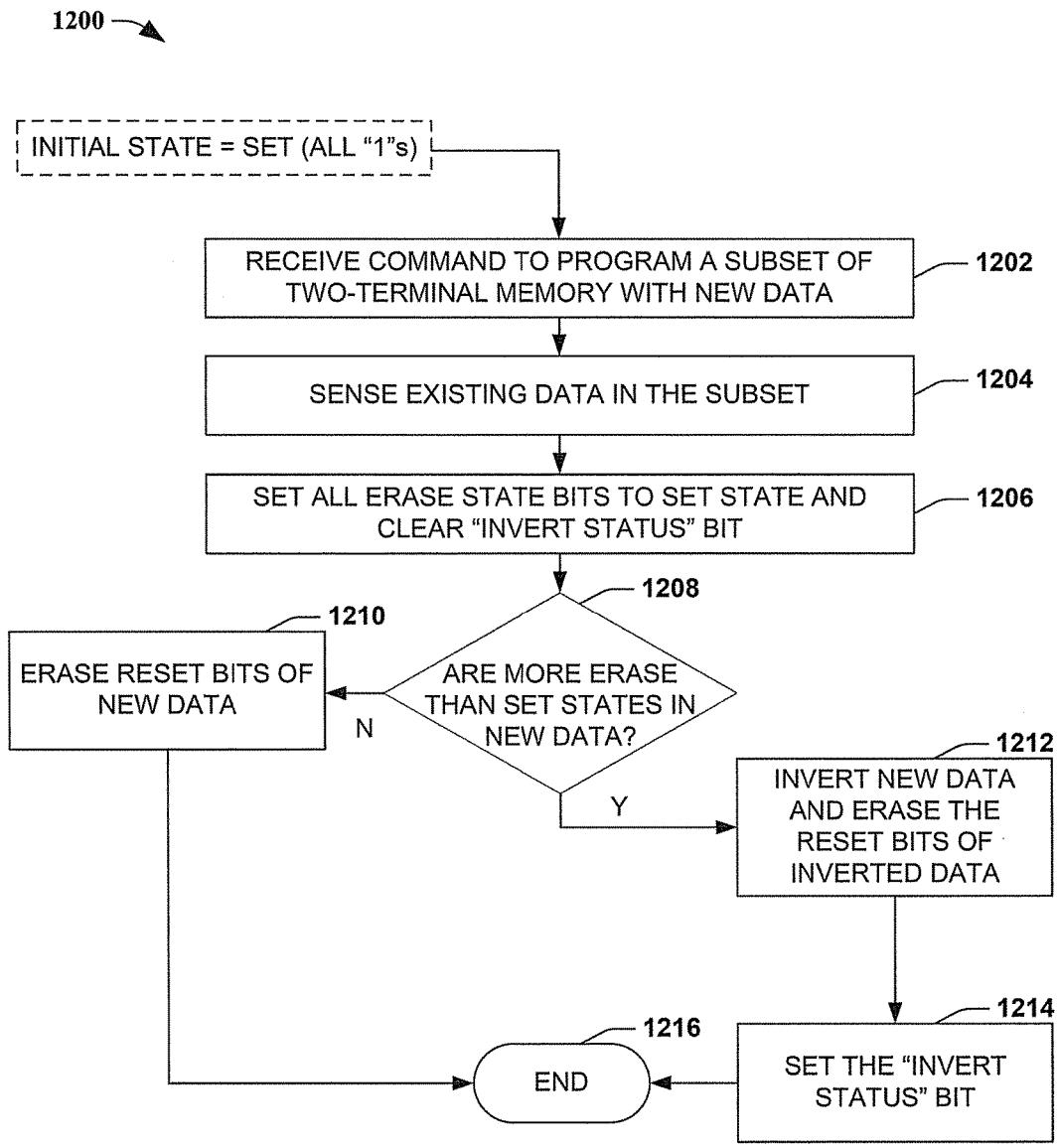
FIG. 12 depicts a flowchart of a sample method for facilitating wear leveling utilizing bit state weighting in yet another embodiment.

FIG. 12 depicts a flowchart of an example method 1200 for providing weighted write/erase programming according to an alternative embodiment of the present disclosure. At 1202, method 1200 can comprise receiving a command to program a subset of two terminal memory with new data. In some embodiments, the subset of two terminal memory can be erased prior to receiving the command, though in other embodiments existing data can be stored in the subset of two terminal memory. At 1204, method 1200 can comprise sensing existing data in the subset of two terminal memory. At 1206, method 1200 can comprise setting all erase state bits to a set state, and clearing an invert status bit. At 1208, method 1200 can comprise determining whether more erase state bits than set state bits are contained in the new data. If the new data comprises more erase state bits, method 1200 can proceed to 1212; otherwise method 1200 can proceed to 1210.

At 1210, method 1200 can comprise erasing appropriate ones of the subset of two terminal memory having reset bits in the new data. This results in the new data being written to the subset of two terminal memory utilizing such that no more than half the memory cells receive the erase pulse. Where the two terminal memory is a technology that consumes more current with the reset operation than with the set operation, setting all bits, then selectively resetting no more than half the bits to accomplish writing new data, can significantly increase longevity of the two terminal memory. From 1210, method 1200 can proceed to 1216 and end.

At 1212, method 1200 can comprise inverting the new data and erasing the reset state bits of the inverted new data to the subset of two terminal memory. At 1214, method 1200 can comprise setting the invert status bit to indicate the data stored in the subset of two terminal memory is inverted data. By inverting the new data—even in the case where the new data comprises more reset bit states—the inverted new data is written to the subset of two terminal memory with erasing no more than half of those memory cells.

Figure 13:
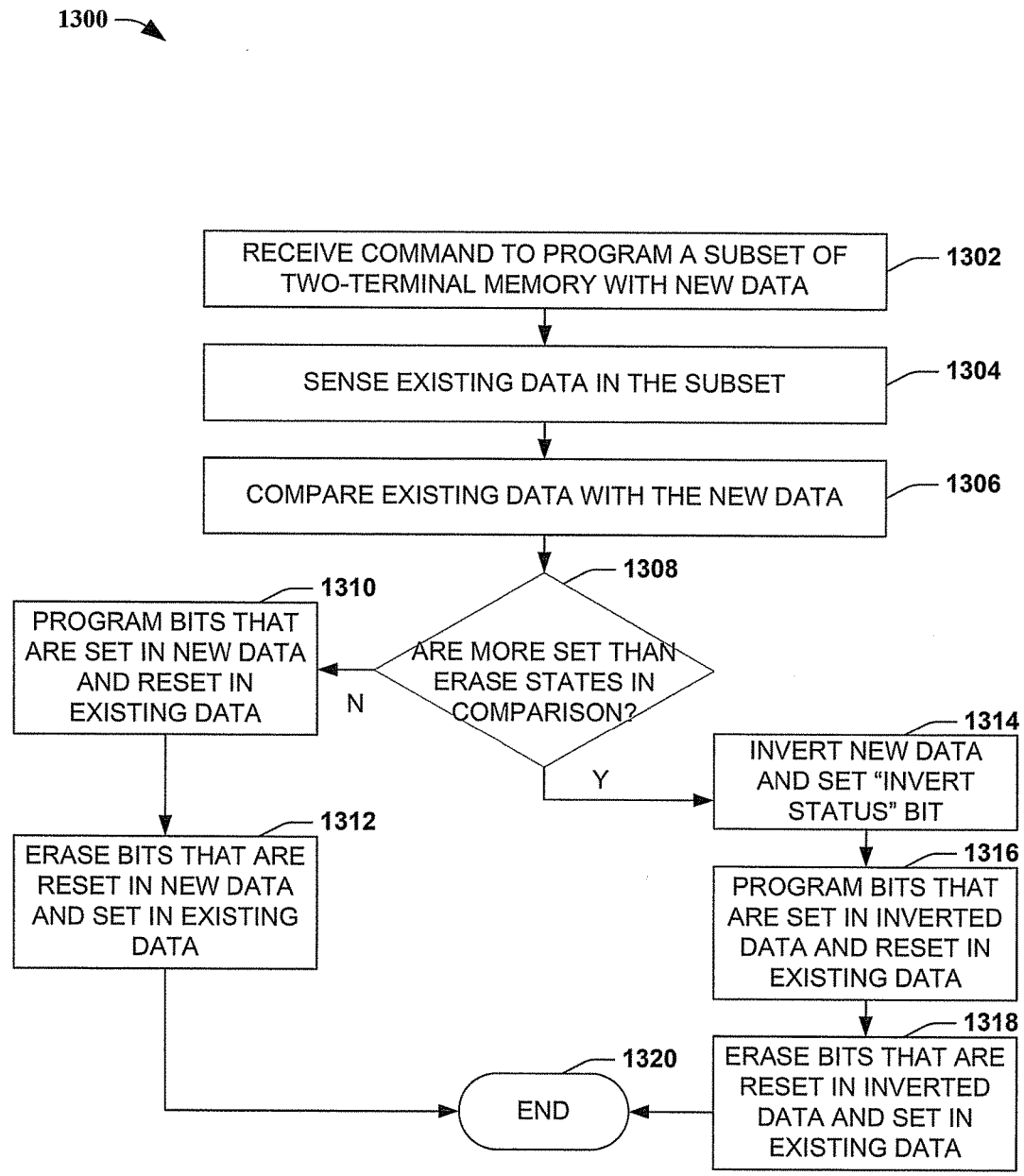
FIG. 13 illustrates a flowchart of an example method for facilitating wear leveling utilizing bit state weighting according to still further embodiments.

FIG. 13 depicts a flowchart of a sample method 1300 for providing enhanced wear leveling and array management according to still other embodiments of the present disclosure. In one or more embodiments, method 1300 can combine benefits of previous disclose wear leveling and data management techniques. For instance, method 1300 can be configured to invert data requiring high current consumption operations, while programming or erasing only those bits required to change existing data to new data (or new inverted data).

At 1302, method 1300 can comprise receiving a command to program a subset of two terminal memory with new data. The two terminal memory can be in an initial reset state (having all bits erased), or can store existing data. At 1304, method 1300 can comprise sensing existing data in the subset of two terminal memory, and at 1306, can comprise comparing existing data with the new data and outputting an exclusive-or (XOR) result of the comparison. At 1308, a determination is made as to whether there are more set state bits than reset state bits in the exclusive-or result. If the exclusive-or output has more set state bits, method 1300 can proceed to 1314; otherwise method 1300 can proceed to 1310.

At 1310, method 1300 can comprise programming bits that are set in the new data and reset in the existing data. At 1312, method 1300 can comprise erasing bits that are reset in the new data and set in the existing data. From 1312, method 1300 can proceed to 1320 and end.

At 1314, method 1300 can comprise inverting new data and setting an invert status but. At 1316, method 1300 can comprise programming bits that are set in the inverted data and erased in the existing data. At 1318, method 1300 can comprise erasing bits that are reset in the inverted data and set in the existing data. From 1318, method 1300 can proceed to 1320 and end.

Figure 14:
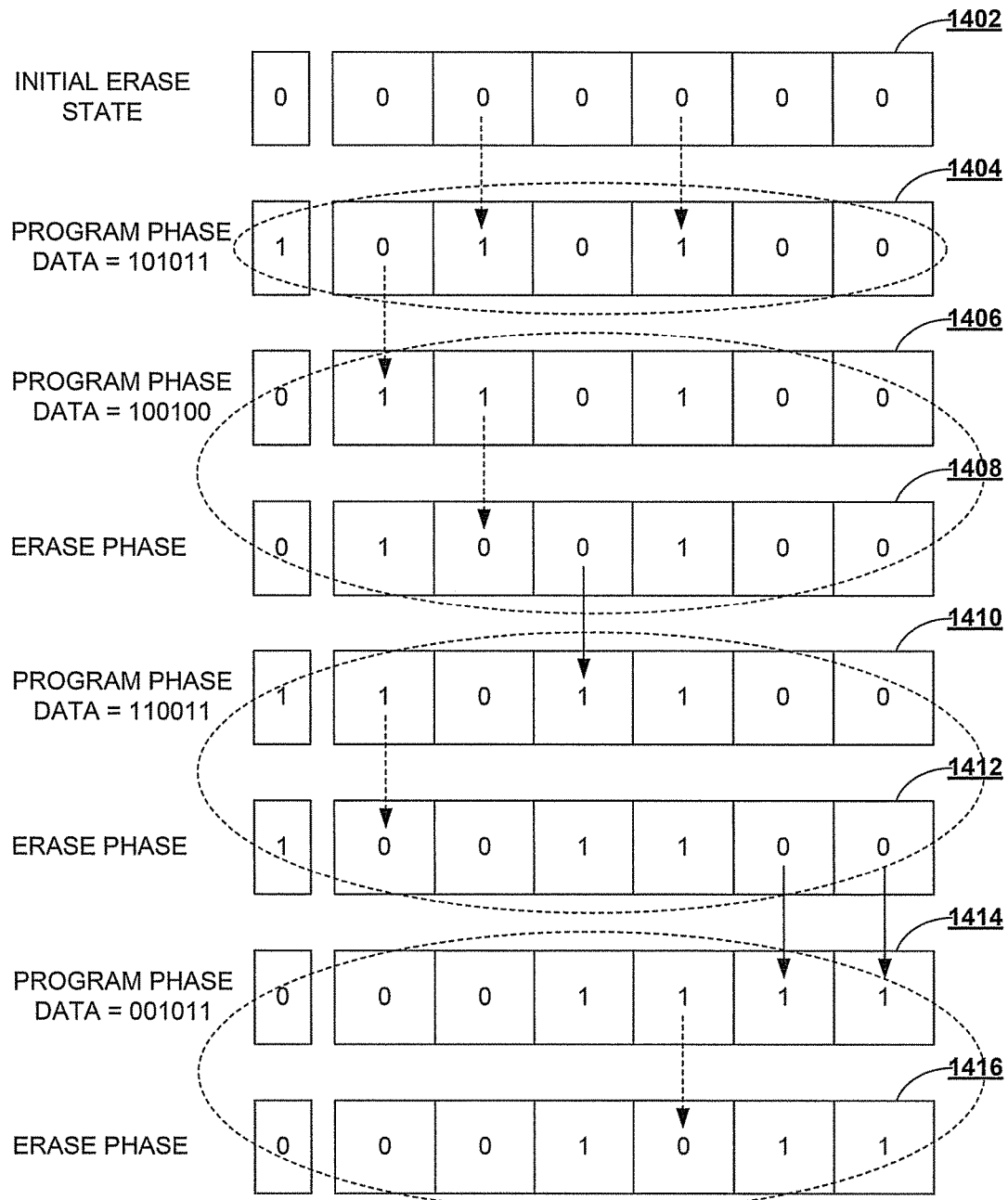
FIG. 14 depicts a diagram of a sample progress of data for a set of write operations utilizing bit state weighting in additional embodiments.

FIG. 14 depicts a diagram of example write/erase sequences 1400 associated with enhanced wear leveling and array management according to one or more disclosed embodiments. Write/erase sequences 1400 begin in an initial state, with all memory cells in a reset state 1402. A first new data set 1-0-1-0-1-1 is received, and an exclusive-or comparison with reset state 1402 results in four set state bits for the exclusive-or comparison. Accordingly, the first new data is inverted, the invert status bit is set and two set bits in the inverted first new data are programmed to obtain inverted first new data set 1404. A second new data set 1-0-0-1-0-0 is received and is compared in an exclusive-or comparison to inverted first new data set 1404. The exclusive-or comparison comprises fewer set bits, and thus the invert status bit is cleared. A program phase is implemented, programming reset bits from inverted first new data set 1404 that are set in the second new data set, resulting in an intermediate data set 1406. An erase phase then erases set bits from the inverted first new data set 1404 that are reset in the second new data set, resulting in the second new data set 1408.

A third new data set 1-1-0-0-1-1 can be received, and compared in an exclusive-or to second new data set 1408. The exclusive-or results in 5 set bits: bits that would have to be changed to transition from second new data set 1408 to the third new data set. Accordingly, the invert status is set and a program phase is implemented to program reset bits of second new data set 1408 that are set in inverted third new data set, resulting in a second intermediate data set 1410. An erase phase erases set bits of second new data set 1408 that are reset in the inverted third new data set, resulting in an inverted third new data set 1412. A fourth new data set 0-0-1-0-1-1 is compared in an exclusive-or to inverted third new data set 1412. The exclusive-or has an equal number of set and reset bits (e.g., bits that need to be changed from inverted third new data set to achieve fourth new data set). Accordingly, in the embodiment depicted by write/erase sequences 1400, the invert status bit is cleared and a program phase program reset bits of the inverted third new data set 1412 that are set in the fourth new data set for a third intermediate phase 1414, and an erase phase erases set bits of the inverted third new data set that are reset in the fourth new data set, resulting in fourth new data set 1416. In another embodiment, the invert bit status can be maintained in the set position and suitable write/erase sequences (not depicted by write/erase sequences 1400) as described herein can be implemented for inverted third new data set 1412 to achieve new data set 1416.

Figure 15:
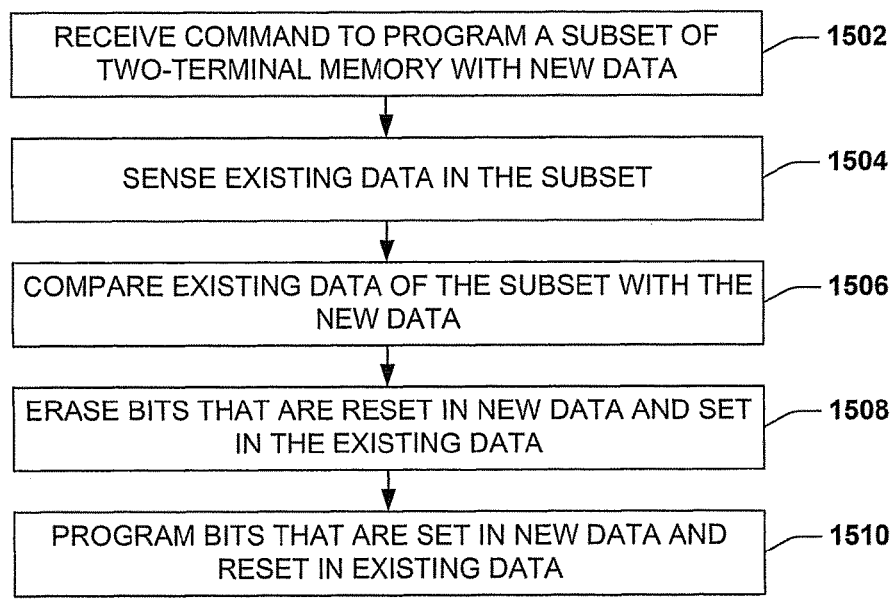
FIG. 15 illustrates a flowchart of a sample method for programming memory according to a wear leveling technique disclosed herein.

FIG. 15 illustrates a flowchart of a sample method for providing wear leveling in one or more further embodiments of the present disclosure. At 1502, method 1500 can comprise receiving a command to program a subset of two terminal memory with new data. At 1504, method 1500 can comprise sensing existing data in the subset of two terminal memory, and at 1506 method 1500 can comprise comparing existing data of the subset of two terminal memory with the new data. In various embodiments, method 1500 can additionally comprise identifying reset bits in the existing data that are set bits in the new data, and identifying set bits in the existing data that are reset bits in the new data. At 1508, method 1500 can comprise erasing bits that are reset in the new data and set in the existing data. At 1510, method 1500 can comprise programming bits that are set in the new data and reset in the existing data.

Figure 16:
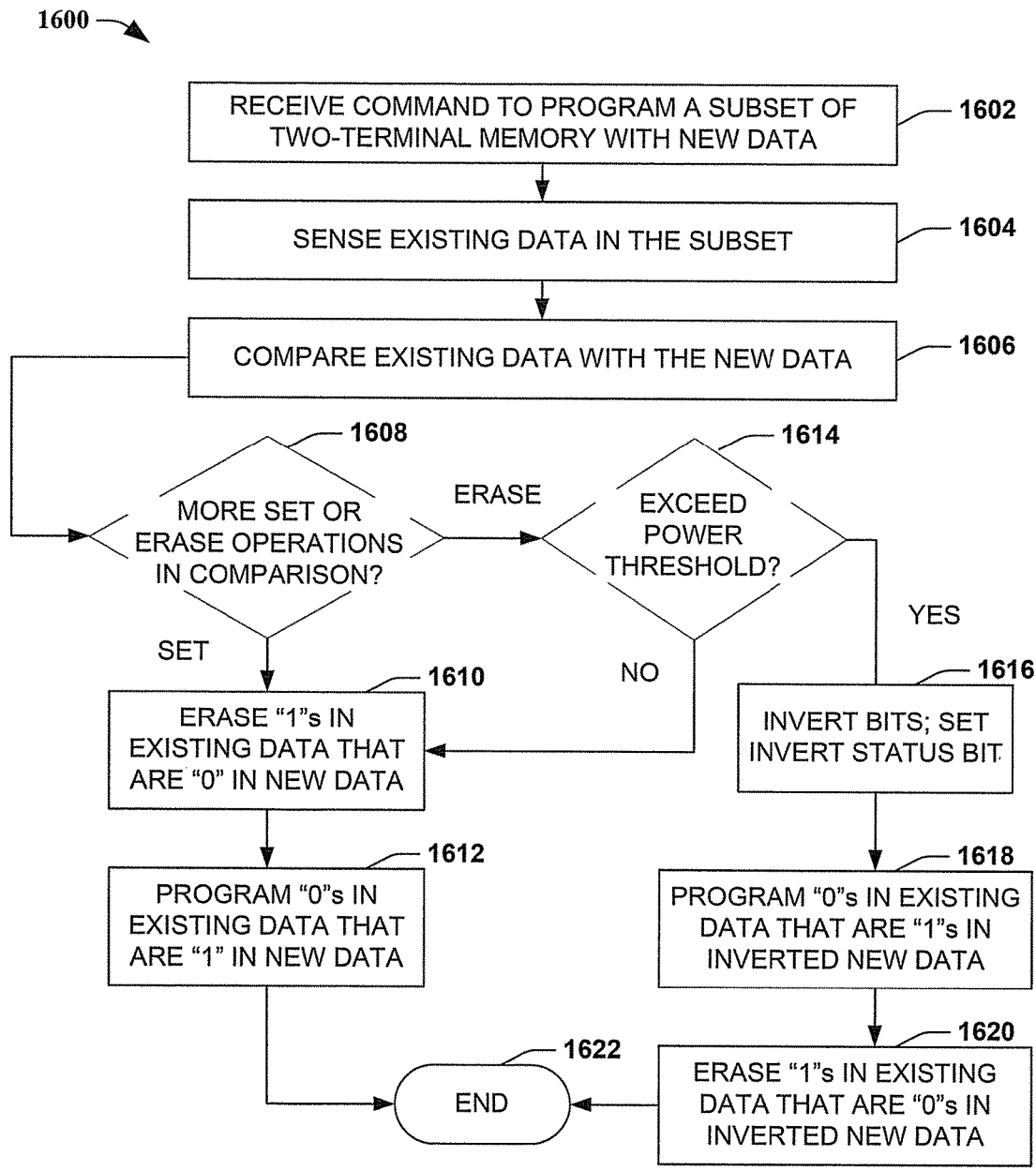
FIG. 16 depicts a flowchart of a sample method for programming memory according to a wear leveling technique employing bit state inversion.

FIG. 16 illustrates a flowchart of a sample method 1600 according to further embodiments of the present disclosure. At 1602, method 1600 can comprise receiving a command to program a subset of two terminal memory with new data. At 1602, method 1600 can comprise sensing existing data in the subset of two terminal memory, and at 1606, method 1600 can comprise comparing existing data with the new data. At 1608, a determination is made as to whether more erase pulses are required to program the new data, or more program pulses. If more erase pulses are required and, e.g., erase pulses consume more current than program pulses, method 1600 can proceed to 1614; otherwise, if more program pulses are required, method 1600 can proceed to 1610.

In an alternative embodiment, the determination at reference number 1608 can incorporate a threshold criterion (e.g., a threshold number of erase pulses, a first threshold power consumption, etc.) in determining whether method 1600 proceeds to reference number 1610 or reference number 1614. As a first example, the determination can be set to prefer a lower power pulse; a program pulse can be preferred over an erase pulse if the program pulse consumes less power, and vice versa. For resistive switching memory, a cycle in which a cell begins in a resistive state and ends in a conductive state can consume less power, since large current flow does not occur until the cell switches to the conductive state. If such a cycle describes a program operation, then the program operation can consume less power for the resistive switching memory, and vice versa where such a cycle describes an erase operation. In this case, the threshold criterion could favor the lower power operation by a number, x, of program versus erase pulses. Thus, where x is 0, an equal number of lower power pulses (e.g., program) and higher power pulses (e.g., erase) can satisfy the threshold criterion, potentially resulting in bit inversion at reference number 1616, below. Where x is 1, one fewer lower power pulse than higher power pulses can satisfy the threshold criterion, where x is 2, two fewer lower power pulses than higher power pulses can satisfy the threshold criterion, and so on. As another example, the threshold criterion can be a power consumption criterion. In this case, where the number of high power pulses consumes the same or about the same total power as the number of low power pulses (presuming a smaller number of the high power pulses), then method 1600 can proceed to 1610 and avoid bit inversion. Where the high power pulses consumes more than the low power pulses, or some percentage y more power (e.g., 55% more power, 60% more power, 70% more power, etc.), the threshold criterion can be met, causing method 1600 to proceed to 1614 and possibly inverting bits.

At 1610, method 1600 can comprise erasing "1"s in the existing data that are "0"s in the new data. At 1612, method 1600 can comprise programming "0"s in the existing data that are "1"s in the new data. From 1612, method 1600 can end at 1622.

At 1614, an optional determination is made as to whether a number of the erase pulses exceeds a second power consumption threshold. This step can be skipped in some embodiments, for instance, where power consumption is utilized as a threshold criterion at reference number 1608, as described above. Where utilized, the power consumption threshold at 1614 can be an additional criterion (e.g., to a numerical criterion at 1608 that compares numbers of pulses, as one example) for bit inversion at 1616. The second power consumption threshold can be similar to the first power consumption threshold, described above. In other embodiments, the second power consumption threshold can be an absolute power consumption (e.g., total electrical power consumed by the sum of the erase pulses), rather than a relative power consumption (e.g., power consumed by erase pulses vs. power consumed by program pulses). If the erase pulses do not exceed the second power consumption threshold, method 1600 can proceed to reference number 1610, as described above; otherwise, method 1600 can proceed to 1616 and invert the existing data, and set an invert status bit. At 1618, method 1600 can comprise programming "0"s in existing data that are "1"s in inverted new data. At 1620, method 1600 can comprise erasing "1"s in the existing data that are "0"s in the inverted new data. Method 1600 can then end at 1622.

Figure 17:
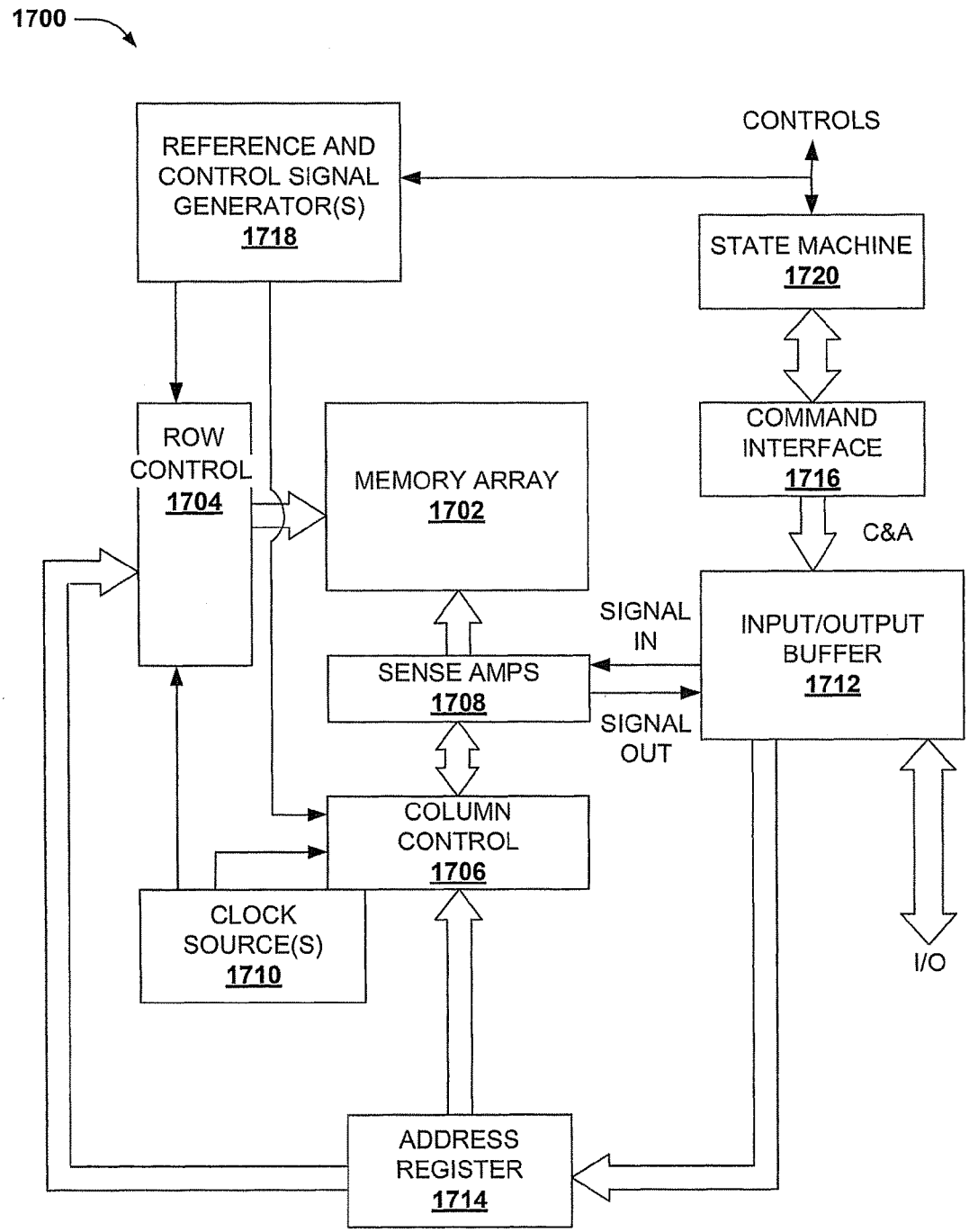
FIG. 17 depicts a block diagram of an example operating and control environment for a memory device according to disclosed embodiments.

FIG. 17 illustrates a block diagram of an example operating and control environment 1700 for a memory array 1702 of a memory cell array according to aspects of the subject disclosure. In at least one aspect of the subject disclosure, memory array 1702 can comprise memory selected from a variety of memory cell technologies. In at least one embodiment, memory array 1702 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing.

A column controller 1706 and sense amps 1708 can be formed adjacent to memory array 1702. Moreover, column controller 1706 can be configured to activate (or identify for activation) a subset of bit lines of memory array 1702. Column controller 1706 can utilize a control signal provided by a reference and control signal generator(s) 1718 to activate, as well as operate upon, respective ones of the subset of bitlines, applying suitable program, erase or read voltages to those bitlines. Non-activated bitlines can be kept at an inhibit voltage (also applied by reference and control signal generator(s) 1718), to mitigate or avoid bit-disturb effects on these non-activated bitlines.

In addition, operating and control environment 1700 can comprise a row controller 1704. Row controller 1704 can be formed adjacent to and electrically connected with word lines of memory array 1702. Also utilizing control signals of reference and control signal generator(s) 1718, row controller 1704 can select particular rows of memory cells with a suitable selection voltage. Moreover, row controller 1704 can facilitate program, erase or read operations by applying suitable voltages at selected word lines.

Sense amps 1708 can read data from, or write data to the activated memory cells of memory array 1702, which are selected by column control 1706 and row control 1704. Data read out from memory array 1702 can be provided to an input/output buffer 1712. Likewise, data to be written to memory array 1702 can be received from the input/output buffer 1712 and written to the activated memory cells of memory array 1702.

A clock source(s) 1708 can provide respective clock pulses to facilitate timing for read, write, and program operations of row controller 1704 and column controller 1706. Clock source(s) 1708 can further facilitate selection of word lines or bit lines in response to external or internal commands received by operating and control environment 1700. Input/output buffer 1712 can comprise a command and address input, as well as a bidirectional data input and output. Instructions are provided over the command and address input, and the data to be written to memory array 1702 as well as data read from memory array 1702 is conveyed on the bidirectional data input and output, facilitating connection to an external host apparatus, such as a computer or other processing device (not depicted, but see e.g., computer 1102 of FIG. 11, infra).

Input/output buffer 1712 can be configured to receive write data, receive an erase instruction, receive a status or maintenance instruction, output readout data, output status information, and receive address data and command data, as well as address data for respective instructions. Address data can be transferred to row controller 1704 and column controller 1706 by an address register 1710. In addition, input data is transmitted to memory array 1702 via signal input lines between sense amps 1708 and input/output buffer 1712, and output data is received from memory array 1702 via signal output lines from sense amps 1708 to input/output buffer 1712. Input data can be received from the host apparatus, and output data can be delivered to the host apparatus via the I/O bus.

Commands received from the host apparatus can be provided to a command interface 1716. Command interface 1716 can be configured to receive external control signals from the host apparatus, and determine whether data input to the input/output buffer 1712 is write data, a command, or an address. Input commands can be transferred to a state machine 1720.

State machine 1720 can be configured to manage programming and reprogramming of memory array 1702 (as well as other memory banks of a multi-bank memory array). Instructions provided to state machine 1720 are implemented according to control logic configurations, enabling state machine to manage read, write, erase, data input, data output, and other functionality associated with memory cell array 1702. In some aspects, state machine 1720 can send and receive acknowledgments and negative acknowledgments regarding successful receipt or execution of various commands. In further embodiments, state machine 1720 can decode and implement status-related commands, decode and implement configuration commands, and so on.

To implement read, write, erase, input, output, etc., functionality, state machine 1720 can control clock source(s) 1708 or reference and control signal generator(s) 1718. Control of clock source(s) 1708 can cause output pulses configured to facilitate row controller 1704 and column controller 1706 implementing the particular functionality. Output pulses can be transferred to selected bit lines by column controller 1706, for instance, or word lines by row controller 1704, for instance.

In connection with FIG. 18, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 18:
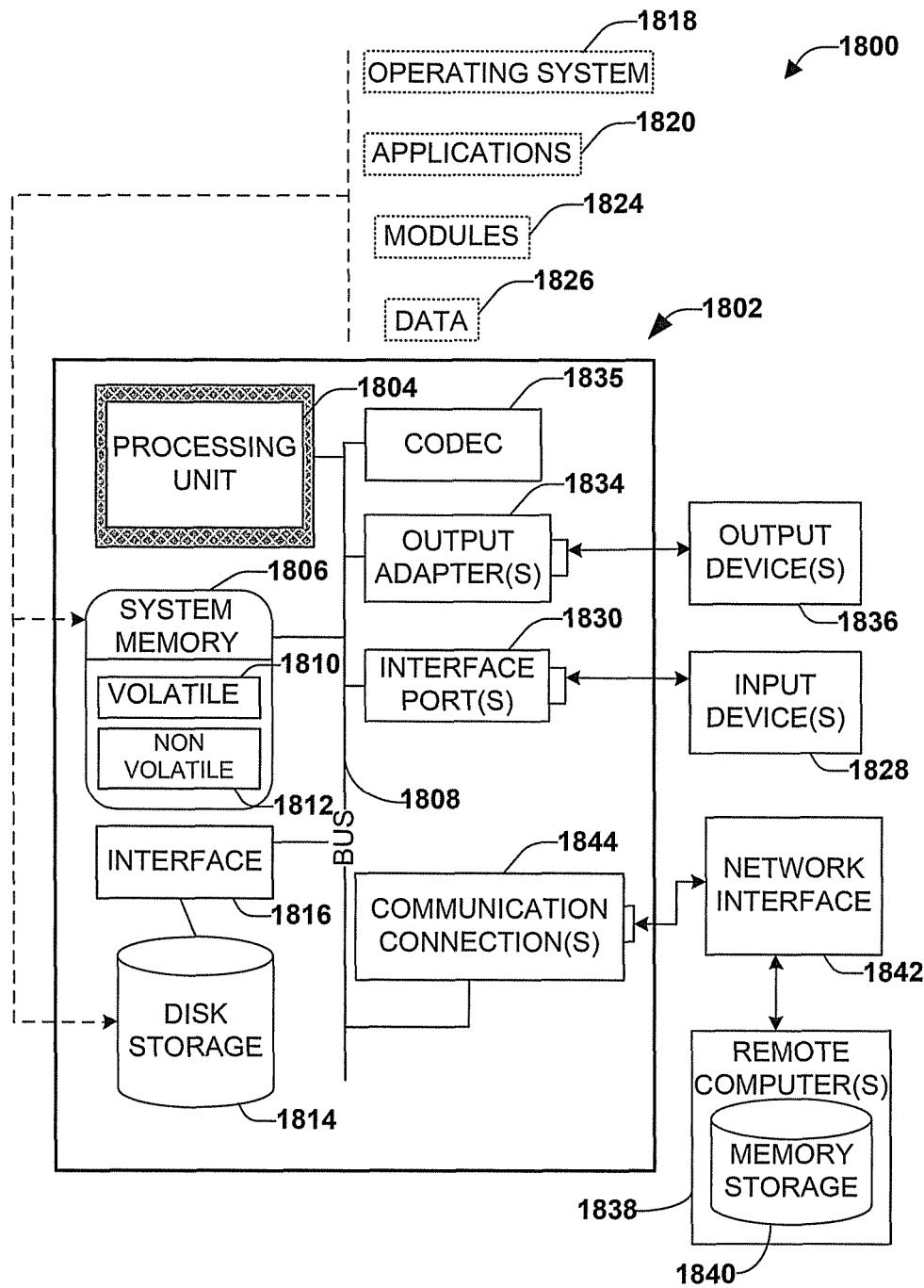
FIG. 18 illustrates a block diagram of an example computing environment that can be implemented in conjunction with various embodiments.

With reference to FIG. 18, a suitable operating environment 1800 for implementing various aspects of the claimed subject matter includes a computer 1802. The computer 1802 includes a processing unit 1804, a system memory 1806, a codec 1835, and a system bus 1808. The system bus 1808 communicatively inter-connects system components including, but not limited to, the system memory 1806 to the processing unit 1804. The processing unit 1804 can be any of various available processors. Dual microprocessors and other multiprocessor architectures also can be employed as the processing unit 1804.

The system bus 1808 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1806 includes volatile memory 1810 and non-volatile memory 1814, which can employ one or more of the disclosed memory architectures, in various embodiments. The basic input/output system (BIOS), containing the basic routines to transfer information between elements within the computer 1802, such as during start-up, is stored in non-volatile memory 1812. In addition, according to present innovations, codec 1835 may include at least one of an encoder or decoder, wherein the at least one of an encoder or decoder may consist of hardware, software, or a combination of hardware and software. Although, codec 1835 is depicted as a separate component, codec 1835 may be contained within non-volatile memory 1812. By way of illustration, and not limitation, non-volatile memory 1812 can include read only memory (ROM), programmable ROM (PROM), electrically programmable ROM (EPROM), electrically erasable programmable ROM (EEPROM), Flash memory, or two-terminal memory (e.g., resistive-switching memory). Non-volatile memory 1812 can employ one or more of the disclosed memory architectures, in at least some disclosed embodiments. Moreover, non-volatile memory 1812 can be computer memory (e.g., physically integrated with computer 1802 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1810 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1802 may also include removable/non-removable, volatile/non-volatile computer storage medium. FIG. 18 illustrates, for example, disk storage 1814. Disk storage 1814 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1814 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1814 to the system bus 1808, a removable or non-removable interface is typically used, such as interface 1816. It is appreciated that disk storage 1814 can store information related to a user. Such information might be stored at or provided to a server or to an application running on a user device. In one embodiment, the user can be notified (e.g., by way of output device(s) 1836) of the types of information that are stored to disk storage 1814 and/or transmitted to the server or application. The user can be provided the opportunity to opt-in or opt-out of having such information collected and/or shared with the server or application (e.g., by way of input from input device(s) 1828).

It is to be appreciated that FIG. 18 describes software that acts as an intermediary between users and the basic computer resources described in the suitable operating environment 1800. Such software includes an operating system 1818. Operating system 1818, which can be stored on disk storage 1814, acts to control and allocate resources of the computer 1802. Applications 1820 take advantage of the management of resources by operating system 1818 through program modules 1824, and program data 1826, such as the boot/shutdown transaction table and the like, stored either in system memory 1806 or on disk storage 1814. It is to be appreciated that the claimed subject matter can be implemented with various operating systems or combinations of operating systems.

A user enters commands or information into the computer 1802 through input device(s) 1828. Input devices 1828 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1804 through the system bus 1808 via interface port(s)

1830. Interface port(s) 1830 include, for example, a serial port, a parallel port, a game port, and a universal serial bus (USB). Output device(s) 1836 use some of the same type of ports as input device(s) 1828. Thus, for example, a USB port may be used to provide input to computer 1802 and to output information from computer 1802 to an output device 1836. Output adapter 1834 is provided to illustrate that there are some output devices, such as monitors, speakers, and printers, among other output devices, which require special adapters. The output adapter 1834 can include, by way of illustration and not limitation, video and sound cards that provide a means of connection between the output device 1836 and the system bus 1808. It should be noted that other devices and/or systems of devices provide both input and output capabilities such as remote computer(s) 1838.

Computer 1802 can operate in a networked environment using logical connections to one or more remote computers, such as remote computer(s) 1838. The remote computer(s) 1838 can be a personal computer, a server, a router, a network PC, a workstation, a microprocessor based appliance, a peer device, a smart phone, a tablet, or other network node, and typically includes many of the elements described relative to computer 1802. For purposes of brevity, only a memory storage device 1840 is illustrated with remote computer(s) 1838. Remote computer(s) 1838 is logically connected to computer 1802 through a network interface 1842 and then connected via communication connection(s) 1844. Network interface 1842 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1844 refers to the hardware/software employed to connect the network interface 1842 to the system bus 1808. While communication connection 1844 is shown for illustrative clarity inside computer 1802, it can also be external to computer 1802. The hardware/software necessary for connection to the network interface 1842 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of programming two terminal memory cells, comprising:
   receiving write data to program to a target group of two terminal memory cells, wherein the write data comprises a first plurality of bit values;
   receiving read data stored by the target group of two terminal memory cells, wherein the read data comprises a second plurality of bit values;
   determining a first group of bits in the target group of two terminal memory cells that are being set, in response to the first plurality of bit values and the second plurality of bit values, wherein the first group of bits is associated with a first number of bits;
   determining a second group of bits in the target group of two terminal memory cells that are being reset, in response to the first plurality of bit values and the second plurality of bit values, wherein the second group of bits is associated with a second number of bits;
   determining whether the first number of bits satisfies a criterion defined by a function of the first number of bits and the second number of bits, wherein:
   the function compares the first number of bits to the second number of bits, and the criterion is satisfied in response to a ratio of the first number of bits and the second number of bits exceeding a threshold ratio;
   the threshold ratio is selected from a group consisting of: about 1:1, about 3:2, and about 5:4; and at least one of:
   determining a third group of bits in the target group of two terminal memory cells to set in response to the first number of bits satisfying the criterion, and setting bits in the third group of bits in the target group of two terminal memory cells, the determined third group of bits being inclusive of the null set; or
   setting bits in the first group of bits in the target group of two terminal memory cells in response to the first number of bits not satisfying the criterion.

2. The method of claim 1 further comprising at least one of:
   determining a fourth group of bits in the target group of two terminal memory cells to reset in response to the first number of bits satisfying the criterion, and resetting bits in the fourth group of bits in the target group of two terminal memory cells, the determined fourth group of bits being inclusive of the null set; or
   resetting bits in the second group of bits in the target group of two terminal memory cells in response to the first number of bits not satisfying the criterion.

3. The method of claim 1, wherein the function further compares the first number of bits to the second number of bits, and the criterion is additionally satisfied in response to the first number of bits being greater than or equal to the second number of bits.

4. The method of claim 1, wherein the function further compares an amount of power associated with setting the first number of bits and an amount of power associated with resetting the second number of bits.

5. The method of claim 1
wherein the function further incorporates a comparison of the first number of bits, the second number of bits, and a polarity preference; and
wherein the polarity preference is selected from a group consisting of: a set state and a reset state.

6. The method of claim 1
wherein a fourth group of bits in the target group of two terminal memory cells are not set or reset, wherein the fourth group of bits is associated with a third number of bits; and
wherein the function depends from the third number of bits in addition to the first number of bits and the second number of bits.

7. The method of claim 6 wherein the criterion is alternatively satisfied in response to a sum of the first number of bits and the second number of bits being greater than or equal to the third number of bits.

8. The method of claim 6
wherein the criterion is alternatively satisfied in response to a ratio between a sum of the first number of bits and the second number of bits, and the third number of bits exceeding a second threshold ratio; and
wherein the second threshold ratio is selected from a group consisting of: about 1:1, about 3:2, and about 5:4.

9. The method of claim 1 wherein the two terminal memory cells comprise resistive switching memory cells.

10. The method of claim 1, wherein determining the first group of bits and determining the second group of bits further comprises implementing an exclusive-or logic operation on the write data and the read data.

11. A memory device comprising:
a plurality of two terminal memory cells including a target group of two terminal memory cells, wherein the target group of two terminal memory cells is configured to store read data comprising a first plurality of bit values;
a data input portion configured to store write data to be programmed to the target group of two terminal memory cells, wherein the write data comprises a second plurality of bit values;
a computation portion coupled to the plurality of two terminal memory cells and the data input portion, wherein the computation portion is configured to determine a first subset of bits in the target group of two terminal memory cells to set and configured to determine a second subset of bits in the target group of two terminal memory cells to reset, in response to a state analysis of the first plurality of bit values and the second plurality of bit values, wherein the first subset of bits are associated with a first number of bits, and wherein the second subset of bits are associated with a second number of bits;
a comparator coupled to the computation portion, wherein the comparator is configured to determine whether a predefined relationship exists between the first plurality of bit values and the second plurality of bit values, and to set an invert condition in response to determining the predefined relationship exists between the first number of bits and the second number of bits, wherein:
the predefined relationship exists in response to a ratio between a sum of the first number of bits and the second number of bits, and the third number of bits exceeds a threshold ratio, and
the threshold ratio is selected from a group consisting of: about 1:1, about 3:2, and about 5:4;
a set determination portion coupled to the comparator, the plurality of two terminal memory cells and the data input portion, wherein the set determination portion is configured to determine a third subset of bits in the target group of two terminal memory cells to set from the write data and the read data, in response to the invert condition being set; and
a set portion coupled to the set determination portion and the plurality of two terminal memory cells, wherein the set portion is configured to set bits in the third subset of bits in the target group of two terminal memory cells in response to the invert condition being set, and wherein the set portion is configured to set bits in the first subset of bits in the target group of two terminal memory cells in response to the invert condition not being set.

12. The device of claim 11 further comprising:
a reset determination portion coupled to the comparator, the plurality of two terminal memory cells and the data input portion, wherein the reset determination portion is configured to determine a fourth subset of bits in the target group of two terminal memory cells to reset from the write data and the read data in response to the invert condition being set; and
a reset portion coupled to the reset determination portion and the plurality of two terminal memory cells, wherein the reset portion is configured to reset bits in the fourth subset of bits in the target group of two terminal memory cells in response to the invert condition being set, and wherein the set portion is configured to reset bits in the second group of bits in the target group of two terminal memory cells in response to the invert condition not being set.

13. The device of claim 11 wherein the predefined relationship exists in response to the first number of bits being greater than or equal to the second number of bits.

14. The device of claim 11 wherein the predefined relationship exists in response to a ratio between the first number of bits and the second number of bits exceeding a threshold ratio.

15. The device of claim 11 wherein the predefined relationship alternatively is a function of power consumed in setting the first number of bits and power consumed in resetting the second number of bits.

16. The device of claim 11
wherein the predefined relationship is further a function of the first number of bits, the second number of bits, and a polarity preference; and
wherein the polarity preference is selected from a group consisting of: a set state and a reset state.

17. The device of claim 11
wherein a fourth subset of bits in the target group of two terminal memory cells are not set or reset, and wherein the fourth group of bits is associated with a third number of bits; and
wherein the predefined relationship is further a function of the first number of bits, the second number of bits, and the third number of bits.

18. The device of claim 17
wherein the predefined relationship exists alternatively in response to a sum of the first number of bits and the second number of bits being greater than or equal to the third number of bits.

19. The device of claim 11 the two terminal memory cells comprise resistive switching memory cells.

20. The memory device of claim 11, wherein the computation portion employs exclusive-or logic utilizing the read data and the write data to determine the first subset of bits to set and the second subset of bits to reset.

21. A method of programming a two terminal memory, comprising:
- receiving new data to program to a page of two terminal memory;
- sensing existing data in the page of two terminal memory;
- identifying bit values of the new data and bit values of the existing data, and comparing the bit values of the new data with the bit values of the existing data;
- determining whether writing the bit values of the new data to the page of two terminal memory requires more set pulses or more reset pulses;
- obtaining an operational preference for set pulses or reset pulses for the two terminal memory determined from satisfaction of a power consumption threshold criterion associated with the operational preference, wherein the power consumption threshold criterion compares power consumed by erase pulses with power consumed by program pulses required to write the bit values of the new data to the page of two terminal memory; and at least one of:
- erasing cells of the page of two terminal memory that store set bits of the existing data and that correspond to reset bits in the new data, in response to the operational preference being a preference for reset pulses; or
- programming cells of the page of two terminal memory that store reset bits of the existing data and that correspond to set bits in the new data, in response to the operational preference being a preference for set pulses.

22. The method of claim 21, wherein the erasing cells of the page or programming cells of the page is conditioned on satisfaction at least of the power consumption threshold criterion.

23. The method of claim 22, wherein the operational preference is determined additionally in part from satisfaction of a relative pulse number criterion, comparing a difference in a first number of erase pulses and a second number of program pulses required to write the bit values of the new data to the page of two terminal memory.

24. The method of claim 22, further comprising at least one of:
- programming the cells of the two terminal memory in response to the operational preference being a preference for reset pulses, and in response to failure of the power consumption threshold criterion; or
- erasing the cells of the two terminal memory in response to the operational preference being a preference for set pulses, and in response to the failure of the power consumption threshold criterion.

25. The memory device of claim 21, wherein determining whether writing the bit values of the new data to the page of two terminal memory requires more set pulses or more reset pulses further comprises implementing an exclusive-or logic operation on the new data and the existing data.

* * * * *